US006822682B1

(12) United States Patent
Kawajiri et al.

(10) Patent No.: US 6,822,682 B1
(45) Date of Patent: Nov. 23, 2004

(54) SOLID STATE IMAGE PICKUP DEVICE AND ITS READ METHOD

(75) Inventors: Kazuhiro Kawajiri, Miyagi (JP); Shinji Uya, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 734 days.

(21) Appl. No.: 09/629,621

(22) Filed: Jul. 31, 2000

(30) Foreign Application Priority Data

Aug. 18, 1999 (JP) .......................................... 11-231999
Aug. 18, 1999 (JP) .......................................... 11-232000

(51) Int. Cl.[7] ........................ H04N 5/335; H04N 5/225; H01L 27/00
(52) U.S. Cl. ..................... 348/315; 348/319; 348/220.1; 250/208.1
(58) Field of Search ................................ 348/315, 294, 348/311, 316, 317, 312, 320, 319, 220.1; 250/208.1

(56) References Cited

U.S. PATENT DOCUMENTS

| 4,012,587 | A | * | 3/1977 | Ochi et al. ................... 348/315 |
| 4,200,892 | A | * | 4/1980 | Weimer ....................... 348/281 |
| 4,336,556 | A | * | 6/1982 | Sekine et al. ................ 348/319 |
| 4,558,365 | A | * | 12/1985 | Ochi .......................... 348/275 |
| 4,602,289 | A | * | 7/1986 | Sekine ........................ 348/315 |
| 4,656,518 | A | * | 4/1987 | Kosonocky et al. ........ 348/320 |
| 4,884,143 | A | * | 11/1989 | Uya ............................ 348/311 |
| 5,274,476 | A | * | 12/1993 | Lee ............................. 348/319 |
| 5,306,906 | A | * | 4/1994 | Aoki et al. ............... 250/208.1 |
| 6,236,434 | B1 | * | 5/2001 | Yamada ...................... 348/315 |

FOREIGN PATENT DOCUMENTS

JP          10-136244        *   5/1998         .......... H04N/5/225

* cited by examiner

Primary Examiner—Andrew Christensen
Assistant Examiner—Nhan Tran
(74) Attorney, Agent, or Firm—Arent Fox, PLLC

(57) ABSTRACT

A solid state image pickup device including: a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at a half pitch of the first pixel pitch in the vertical direction relative to the first pixel column, the second pixel columns being disposed in the horizontal direction at a half pitch of a second pixel pitch of pixels of adjacent first pixel columns of the pixel groups; a first separation region formed between pairs of the pixel groups adjacent in the horizontal direction; a single vertical charge transfer path extending in the vertical direction and weaving between the first and second pixel columns of each of the pixel groups; and a horizontal charge transfer path formed at one ends of a plurality of the vertical charge transfer paths for receiving electric charges transferred from the vertical charge transfer paths and transferring the electric charges in the horizontal direction. A patterning precision of horizontal charge transfer electrodes can be mitigated.

15 Claims, 19 Drawing Sheets

SOLID STATE IMAGE PICKUP DEVICE AND ITS READ METHOD

This application is based on Japanese Patent Applications HEI 11-231999 and HEI 11-232000 filed on Aug. 18, 1999, all the contents of which are incorporated herein by reference.

BACKGROUND OF THE INVENTION a) Field of the Invention

The present invention relates to a solid state image pickup device, and more particularly to a solid state image pickup device whose adjacent pixels are disposed shifted by a half pitch between pixels in both vertical and horizontal directions, and to its read method.

b) Description of the Related Art

High integration of pixels has been desired for a solid state image pickup device such as a CCD solid state image pickup device.

FIG. 18 is a plan view of a general interline type CCD solid state image pickup device.

The solid state image pickup device is formed on a semiconductor substrate 201 made of, for example, silicon.

A CCD solid state image pickup device X formed on the semiconductor substrate 201 includes pixels 203, vertical charge transfer paths 205, a horizontal charge transfer path 207 and an output amplifier 211. A plurality of pixels 203 are regularly disposed on the semiconductor substrate 201 in the vertical and horizontal directions.

Each pixel 203 includes a photodiode (photoelectrical conversion element) 203a and a read gate (transfer gate) 203b. The photodiode 203a converts incident light into electric charges and stores the electric charges. The transfer gate 203b reads the electric charges stored in the photodiode 203a to the vertical charge transfer path 205.

Each pixel column P11 constituted of a plurality of pixels 203 disposed in the vertical direction is provided with one vertical charge transfer path 205. The vertical charge transfer path 205 is made of, for example, an n-type conductive layer formed on the semiconductor substrate 201. The horizontal charge transfer path 207 is disposed at the lower ends of the vertical charge transfer paths 205.

The horizontal charge transfer path 207 is constituted of mainly an n-type conductive layer 208 in the semiconductor substrate 201 and horizontal charge transfer electrodes 221 made of two polysilicon layers (first and second polysilicon layers) formed on the semiconductor substrate 201.

The n-type conductive layer 208 includes high concentration regions 208a having a high n-type impurity concentration and low concentration regions 208b having a low n-type impurity concentration formed alternately. The high concentration region 208a forms a potential well having a low potential energy. The low concentration region 208b forms a potential barrier having a high potential energy. Potential barriers and potential wells are alternately disposed in the horizontal direction. Two pairs of one potential barrier and one potential well form one charge transfer packet (hereinafter simply called a "packet"). A number of packets are formed along the horizontal direction.

First polysilicon layer electrodes (horizontal transfer electrodes 221-1, 221-3, 221-5, . . . , refer to FIG. 19) are formed on the high concentration regions 208a (potential wells), and second polysilicon layer electrodes (horizontal transfer electrodes 221-0, 221-2, 221-4, . . . , refer to FIG. 19) are formed on the low concentration regions 208b (potential barriers).

The horizontal charge transfer electrodes 221-0 and 221-1 are connected together and a voltage $\phi 1$ is applied to these electrodes. The horizontal charge transfer electrodes 221-2 and 221-3 are connected together and a voltage $\phi 2$ is applied to these electrodes. Similarly, the horizontal charge transfer electrode 221-4 and 221-5 are connected together and the voltage $\phi 1$ is applied to these electrodes.

As shown in FIG. 19, two vertical charge transfer electrodes 215, e.g., vertical charge transfer electrodes 215-1 and 215-2, are formed on the vertical charge transfer path 205 in a space between adjacent pixels disposed in the row direction.

Voltages V1 to V4 are applied to the vertical charge transfer electrodes 215-1, 215-2, 215-3 and 215-4. Similarly the voltages V1 to V4 are applied to the vertical charge transfer electrodes 215-5 to 215-8, and 215-9 to 215-12. The voltages V1 to V4 are, for example, 0 V for forming a potential barrier in the vertical charge transfer path, 8 V for forming a charge transfer potential well, and 15 V for reading electric charges from pixels.

The vertical charge transfer path 205 is electrically connected to one potential well region of each packet of the horizontal charge transfer path 207.

The operation of the solid state image pickup device will be described with reference to FIGS. 18 and 19.

When V1 is set to 15 V, electric charges stored in all the photodiodes 203a connected to the V1 vertical charge transfer electrodes are read via the transfer gates 203b to the vertical charge transfer paths 205.

A relatively low plus voltage, e.g., 8 V, is applied to the vertical charge transfer electrode 215-1, and also to the vertical charge transfer electrodes 215-2 and 215-3. Then, the voltage at the vertical charge transfer electrode 215-1 is reset to 0 V and a voltage of 8 V is applied to the vertical charge transfer electrode 215-4. These operations are repeated to transfer electric charges in the vertical charge transfer path 205 toward the horizontal charge transfer path by a four-phase driving method.

As a relatively low plus voltage, e.g., 8 V, is used as V1, V2 nd V3, and 0 V is used as V4, the read electric charges distribute under three vertical charge transfer electrodes at V1, V2 and V3.

As V1 is reset to 0 V, the electric charges are confined under the electrodes at V2 and V3. As V4 is set to 8 V, the electric charges distribute under the electrodes at V2, V3 and V4. By repeating this operation, the electric charges are transferred in the vertical charge transfer path 205 toward the horizontal charge transfer path by the four-phase driving method.

As the voltage $\phi 1$ of the horizontal charge transfer path is set, for example, to 0 V and the voltage $\phi 2$ to 8 V, electric charges under the $\phi 1$ electrode are transferred to the region under the right side $\phi 2$ electrode. At this time, a potential barrier is formed in the left region of the region under the $\phi 1$ electrode to prevent a counterflow of the electric charges.

Electric charges can therefore be transferred in the horizontal charge transfer path 207 by a two-phase driving method without a mixture of pixels.

With the two-phase driving method using the voltages $\phi 1$ and $\phi 2$, electric charges can be transferred in the horizontal charge transfer path 207.

With the above operations, electric charges can be read from pixels of each line connected to the V1 vertical charge transfer electrode.

Next, electric charges are read from pixels on other rows by a similar method. After electric charges of all pixels for V1 are read, a read pulse is used as V2 to read electric charges from pixels connected to the V2 vertical charge transfer electrodes. Similarly, electric charges are sequentially read from pixels connected to the V3 and V4 vertical charge transfer electrodes.

Electric charges transferred to the horizontal charge transfer path 207 are transferred to the output amplifier 211, for example, by the two-phase driving method. The output amplifier 211 amplifies the electric charges and outputs image signals to the external.

By disposing photodiodes 203a two-dimensionally, signals of a two-dimensional image can be obtained.

In order to meet the requirements of high integration of pixels, it is necessary to make the pixel size fine.

With the solid state image pickup device X described above, one vertical charge transfer path 205 is provided for each pixel column P11. Four horizontal charge transfer electrodes 208a, 208b, 208a and 208b are required in order to transfer electric charges transferred from one vertical charge transfer path 205 to the horizontal charge transfer path 207, to the region of the horizontal charge transfer path 207 connected to the next adjacent vertical charge transfer path 205.

If a pixel 203 is made fine to about 2 to 3 micron square, it becomes difficult to perform fine pattering of horizontal charge transfer electrodes 221. Moreover, as the pixel 203 is made fine, the area of the photoelectric conversion element 203a, e.g., a photodiode, becomes small and the amount of accumulated electric charges reduces. Therefore, a dynamic range cannot be made large.

Still further, as the total number of pixels of a solid state image pickup device increases, it takes a longer time to read image signals of one frame.

A general digital camera has an image signal frame rate of 1/30 second in the National Television System Committee (NTSC) system.

Even if a time to read image signals of a still image picked up with a digital camera is prolonged, there is no serial problem.

A moving image is displayed on a monitor display of a digital camera in real time. In this case, as the number of pixels increases, it becomes difficult to follow the frame rate. If the number of pixels exceeds one million, it is difficult to read image signals from all pixels in 1/30 second. A clear image cannot be obtained.

SUMMARY OF THE INVENTION

It is an object of the present invention to provide a solid state image pickup device capable of providing a high pixel density while mitigating a patterning precision of horizontal charge transfer electrodes.

It is another object of the present invention to provide a solid state image pickup device capable of displaying a clear moving image to be monitored and its control method.

According to one aspect of the present invention, there is provided a solid state image pickup device comprising: a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at a half pitch of the first pixel pitch in the vertical direction relative to the first pixel column, the second pixel columns being disposed in the horizontal direction at a half pitch of a second pixel pitch of pixels of adjacent first pixel columns of the pixel groups; a first separation region formed between pairs of the pixel groups adjacent in the horizontal direction; a single vertical charge, transfer path extending in the vertical direction and weaving between the first and second pixel columns of each of the pixel groups; and a horizontal charge transfer path formed at one ends of a plurality of vertical charge transfer paths for receiving electric charges transferred from the vertical charge transfer paths and transferring the electric charges in the horizontal direction.

According to another aspect of the present invention, there is provided a method of reading a solid state image pickup device, the solid state image pickup device comprising: a plurality of pixel groups disposed on a two-dimensional plane defined by horizontal and vertical directions, the pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at a half pitch of the first pixel pitch in the vertical direction relative to the first pixel column, the second pixel columns being disposed in the horizontal direction at a half pitch of a second pixel pitch of pixels of adjacent first pixel columns of the pixel groups; a first separation region formed between pairs of the pixel groups adjacent in the horizontal direction; a single vertical charge transfer path extending in the vertical direction and weaving between the first and second pixel columns of each of the pixel groups; and a horizontal charge transfer path formed at one ends of a plurality of the vertical charge transfer paths for receiving electric charges transferred from the vertical charge transfer paths and transferring the electric charges in the horizontal direction, wherein: the pixel includes a photoelectric conversion element formed in an area defined by four oblique sides slanted relative to the horizontal and vertical directions; the first separation region is formed along a first set of right or left oblique sides among the four oblique sides of the pixel in the first pixel column; a first read gate is formed near the vertical charge transfer path along one of a second set of upper and lower oblique sides on a side opposite to a region where the first separation region is not formed, and a second separation region is formed along the oblique side where the first read gate is not formed; the first separation region is also formed along a second set of two oblique sides among the four oblique sides of the pixel in the second pixel column on a side opposite to the first pixel column; a second read gate is formed near the vertical charge transfer path along one of a fourth set of two oblique sides not facing the first read gate of the pixel in the first pixel column and on a side opposite to a region where the first separation region is formed, and a third separation region is formed along the oblique side on a side where the second read gate is not formed; and a plurality of vertical charge transfer electrodes are formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction, the method comprises: a first field output step including a step of reading electric charges from the pixels in a first field to the vertical charge transfer paths by applying read pulses to the vertical charge transfer electrodes at an n-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to an external; a second field output step including a step of reading electric charges from the pixels in a second field to the vertical charge transfer paths by applying read pulses to the vertical charge transfer electrodes at an (n+1)-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to the external; and a third field output step including a step of reading electric charges from the pixels in a third field to the vertical charge transfer paths by applying read pulses to the vertical charge transfer electrodes at an (n+2)-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to the external, wherein the first to third fields are different fields of the solid state image pickup device.

A solid state image pick up device, further comprising a driver circuit for independently applying a voltage to each of a set of eight vertical charge transfer electrodes adjacent in the vertical direction among the plurality of vertical charge transfer electrodes; a horizontal charge transfer path formed at one ends of a plurality of the vertical charge transfer paths for receiving electric charges transferred from the vertical charge transfer paths and transferring the electric charges in the horizontal direction; and an output amplifier formed at one end of the horizontal charge transfer path for amplifying electric charges supplied from the horizontal charge transfer path and outputting to an external is preferable.

According to another aspect of the present invention, there is provided a method of reading a solid state image pickup device, the solid state image pickup device comprising: a plurality of pixel groups disposed on a two-dimensional plane defined by horizontal and vertical directions, the pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at a half pitch of the first pixel pitch in the vertical direction relative to the first pixel column, the second pixel columns being disposed in the horizontal direction at a half pitch of a second pixel pitch of pixels of adjacent first pixel columns of the pixel groups; a first separation region formed between pairs of the pixel groups adjacent in the horizontal direction; a single vertical charge transfer path extending in the vertical direction and weaving between the first and second pixel columns of each of the pixel groups; a plurality of vertical charge transfer electrodes formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction; a driver circuit for independently applying a voltage to each of a set of eight vertical charge transfer electrodes adjacent in the vertical direction among the plurality of vertical charge transfer electrodes; a horizontal charge transfer path formed at one ends of a plurality of the vertical charge transfer paths for receiving electric charges transferred from the vertical charge transfer paths and transferring the electric charges in the horizontal direction; and an output amplifier formed at one end of the horizontal charge transfer path for amplifying electric charges supplied from the horizontal charge transfer path and outputting to an external, wherein: the pixel in the first pixel column is a first color pixel including a photoelectric conversion element and a first color filer; and the pixels in the second pixel column comprise a second color pixel including a photoelectric conversion element and a second color filer and a third color pixel including a photoelectric conversion element and a third color filer, the second and third color pixels being alternately disposed in the vertical direction and in the horizontal direction, the method comprises: a) a step of reading electric charges to the vertical charge transfer paths by sequentially applying a read pulse to the first to eighth vertical charge transfer electrodes so as to read the electric charges of a same color from a same vertical charge transfer path; b) a step of transferring the electric charges read to the vertical charge transfer paths toward the horizontal charge transfer path; c) a step of transferring the electric charges read to the horizontal charge transfer path toward the output amplifier; d) amplifying the electric charges supplied from the horizontal charge transfer path and outputting the electric charges to the external; and e) repeating the steps a) to d) for pixels of different rows to read electric charges from all the pixels.

According to another aspect of the present invention, there is provided a method of reading a solid state image pickup device, the solid state image pickup device comprising: a plurality of pixel groups disposed on a two-dimensional plane defined by horizontal and vertical directions, the pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at a half pitch of the first pixel pitch in the vertical direction relative to the first pixel column, the second pixel columns being disposed in the horizontal direction at a half pitch of a second pixel pitch of pixels of adjacent first pixel columns of the pixel groups; a first separation region formed between pairs of the pixel groups adjacent in the horizontal direction; a single vertical charge transfer path extending in the vertical direction and weaving between the first and second pixel columns of each of the pixel groups; a plurality of vertical charge transfer electrodes formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction; a driver circuit for independently applying a voltage to each of a set of eight vertical charge transfer electrodes adjacent in the vertical direction among the plurality of vertical charge transfer electrodes; a horizontal charge transfer path formed at one ends of a plurality of the vertical charge transfer paths for receiving electric charges transferred from the vertical charge transfer paths and transferring the electric charges in the horizontal direction; and an output amplifier formed at one end of the horizontal charge transfer path for amplifying electric charges supplied from the horizontal charge transfer path and outputting to an external, wherein: the pixel in the first pixel column is a first color pixel including a photoelectric conversion element and a first color filer; and the pixels in the second pixel column comprise a second color pixel including a photoelectric conversion element and a second color filer and a third color pixel including a photoelectric conversion element and a third color filer, the second and third color pixels being alternately disposed in the vertical direction and in the horizontal direction, the method comprises: a) a step of reading electric charges from the photoelectric conversion elements to the vertical charge transfer paths by applying a read pulse to two vertical charge transfer electrodes adjacent in the vertical direction among the first to eighth vertical charge transfer electrodes; b) a step of collecting the electric charges read to the vertical charge transfer paths; c) a step of transferring the electric charges from the vertical charge transfer path to the horizontal charge transfer path; d) a step of transferring the electric charges transferred to the horizontal charge transfer path to the output amplifier; and e) amplifying the electric charges supplied from the horizontal charge transfer path and outputting the electric charges to the external.

A patterning precision of a solid state image pickup device, particularly vertical charge transfer paths and vertical charge transfer electrodes, can be mitigated. The patterning precision of a horizontal charge transfer path can also be mitigated. At a given patterning precision, the pixel density can be made higher.

A manufacture yield can be improved. Reliability of solid state image pickup devices can be improved.

With the solid state image pickup device reading method, all pixels of a still image can be read. Moreover, since pixels can be read through thinning, it is easy to read and reproduce a moving image to be monitored.

DETAILED DESCRIPTION OF THE PREFERRED EMBODIMENTS

Embodiments of the invention will be described.

Figure 1:
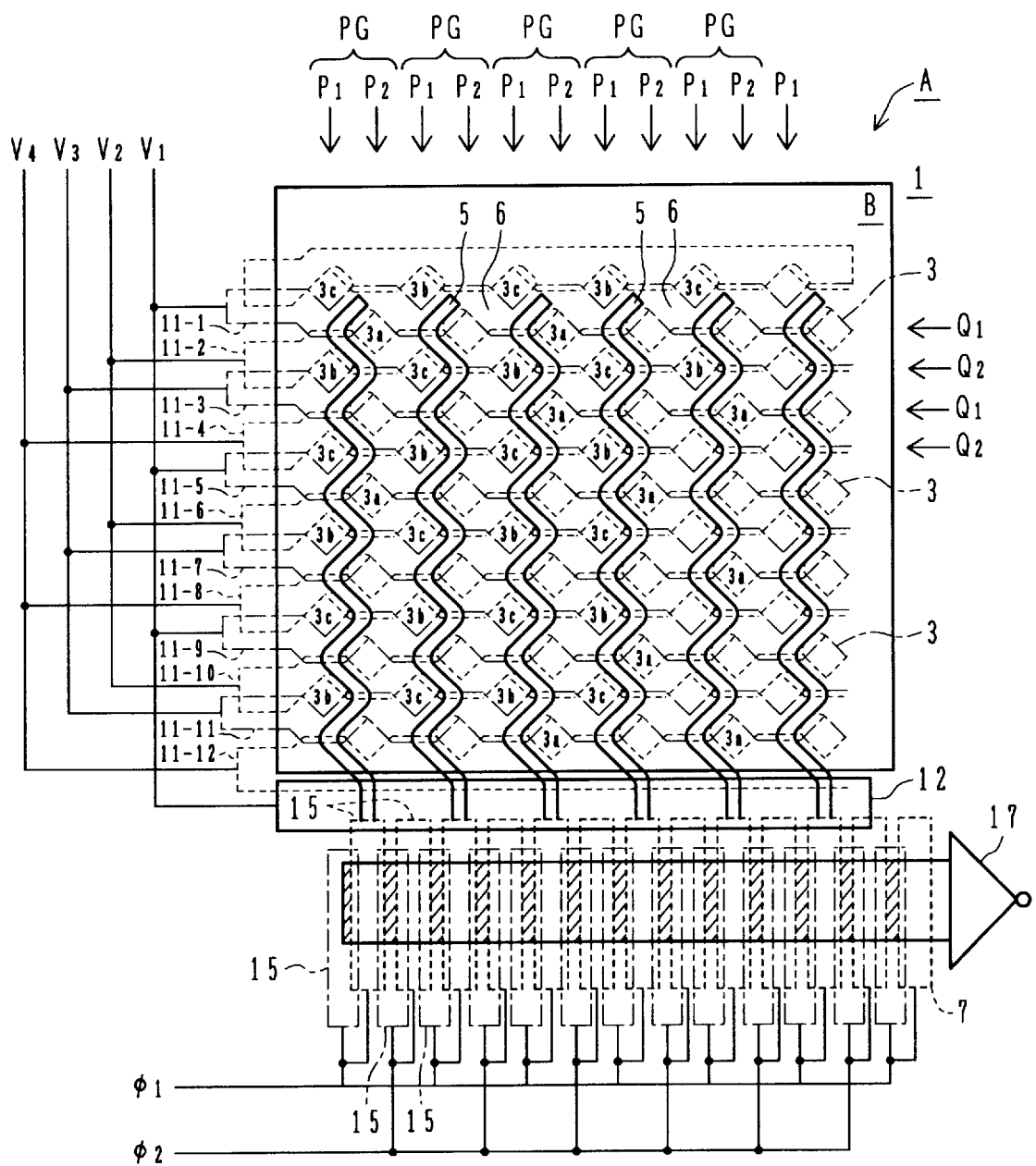
FIG. 1 is a plan view of a solid state image pickup device according to a first embodiment of the invention.

FIG. 1 is a plan view of a solid state image pickup device A according to a first embodiment of the invention.

A solid state image pickup device A includes: a pixel area B in which a plurality of pixels 3 (3a, 3b, 3c) are regularly disposed on a semiconductor substrate 1; vertical charge transfer paths 5 disposed in the pixel area B for transferring electric charges in the pixels 3 in a vertical direction; a horizontal charge transfer path 7 disposed under the pixel area B for transferring electric charges transferred from the vertical charge transfer paths 5 in a horizontal direction; and an amplifier 17 for amplifying electric charges transferred from the horizontal charge transfer path 7.

In the pixel area B, a plurality of pixels 3 are disposed on a two-dimensional plane of the semiconductor substrate 1 in the horizontal (row) and vertical (column) directions. Pixels at every second columns form a matrix of pixels disposed at a first pitch in the vertical direction and at a second pitch in the horizontal direction. Pixels at one column and at the next column are disposed shifted by half pitches of each of the first and second pitches in the vertical and horizontal directions, to thereby constitute a so-called pixel shifted solid state image pickup device.

The pixels 3 are grouped into green pixels 3a, red pixels 3b and blue pixels 3c. Red pixels 3b and blue pixels 3c are alternately disposed in the vertical direction to form a first pixel column P1. In a second pixel column P2 adjacent to the first pixel column P1, green pixels 3a are disposed.

The first and second pixel columns P1 and P2 form one pixel group PG. A plurality of pixel groups PG are disposed in the horizontal direction. As shown in FIG. 1, each pixel is of generally a rhomboid shape having four oblique sides.

Pixels of the second pixel columns P2 are disposed in spaces between rows and columns formed by the pixels 3c, 3b, 3c, . . . of the first pixel columns P1.

As the drawing of FIG. 1 is rotated by 45 degrees, pixels of the first and second pixel columns constitute generally a square matrix.

The vertical charge transfer path 5 (indicated by solid lines) made of n-type semiconductor layers in the semiconductor substrate 1 is of a zigzag shape or weaving shape extending along a space formed between the first and second pixel columns P1 and P2 of each pixel group PG.

Each electrode (vertical charge transfer electrode) 11 of the vertical charge transfer path 5 extends generally in the horizontal direction in a zigzag way along spaces between pixels.

A voltage V1 is applied to vertical charge transfer electrodes 11-1, 11-5 and 11-9. A voltage V2 is applied to vertical charge transfer electrodes 11-2, 11-6 and 11-10. A voltage V3 is applied to vertical charge transfer electrodes 11-3, 11-7 and 11-11. A voltage V4 is applied to vertical charge transfer electrodes 11-4, and 11-8.

Figure 2A:
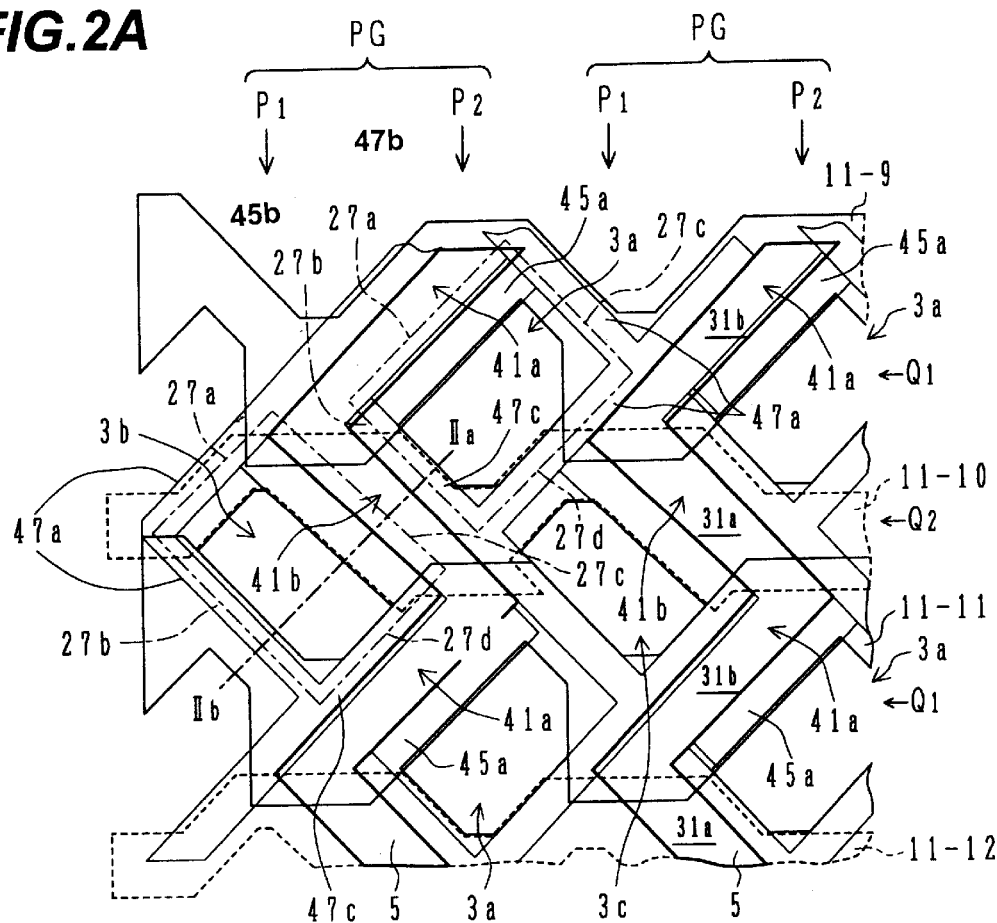
FIG. 2A is an enlarged plan view of a pixel area of the solid state image pickup device shown in FIG. 1.
Figure 2B:
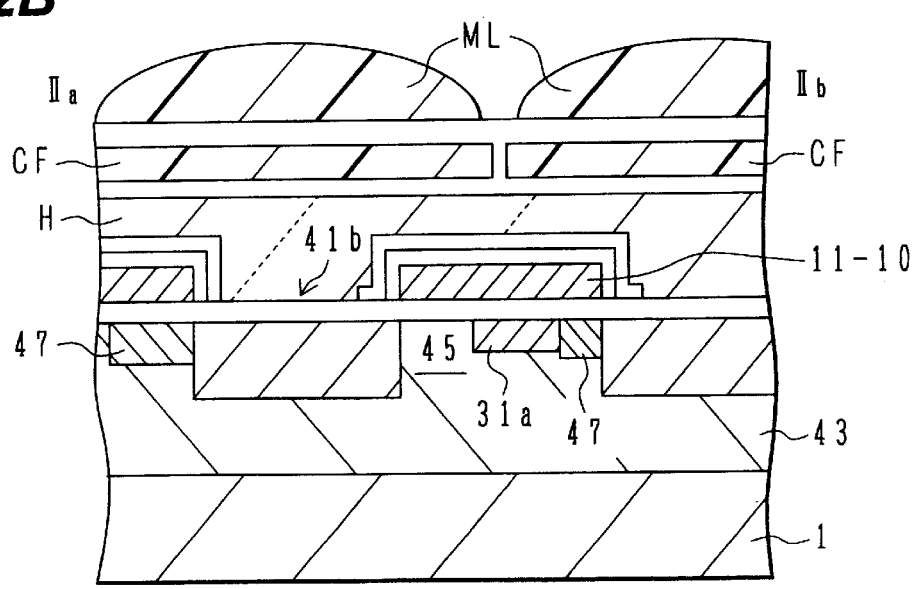
FIG. 2B is a cross sectional view taken along line IIa-IIa of FIG. 2A.

FIGS. 2A and 2B show the main part of the solid state image pickup device shown in FIG. 1. FIG. 2A is a plan view and FIG. 2B is a cross sectional view taken along line Ia-Ib of FIG. 2A.

As shown in FIG. 2A, the pixel 3 (3a, 3b, 3c) is of generally a square shape. Of the four vertices of the square, opposing two vertices of the pixels are generally and regularly disposed in the vertical and horizontal directions. Oblique sides (imaginary lines) coupling the four vertices and extending in a direction of right/left symmetry are called two oblique sides 27a and 27b and two oblique sides 27c and 27d.

In an area surrounded by the four oblique sides 27a, 27b, 27c and 27d of the pixel 3, a photoelectric conversion element (photodiode) 41 (41a, 41b, 41c) is disposed. A transfer gate 45 is formed between a light reception area 41a of the photodiode 41 and the n-type semiconductor layer 31a, 31b partially forming the vertical charge transfer path 5.

The left pixel column group PG of the two pixel column groups PG shown in FIG. 2A will be described.

A first separation region 47a is formed along the first set of two right oblique sides 27c and 27d among the four oblique sides 27a to 27d of the pixel 3a in the second pixel column P2 of the left pixel column group PG.

A first read gate 45a is formed near the vertical charge transfer path 31 along the upper oblique side 27a of the second set of two oblique sides 27a and 27b opposite to the side where the first separation region 47a is formed, and a second separation region 47b is formed along the oblique side 27b where the first read gate 45a is not formed.

In the first pixel column P1 of the same pixel column group PG, a first separation region 47a is formed along the third set of two oblique sides 27a and 27b on the opposite side of the second pixel column P2, among the four oblique sides 27a to 27d of the pixel 3b (at a position where the pixel 3a is moved in parallel) in the first pixel column P2.

A second read gate 45b is formed near the vertical charge transfer path 5 along the oblique side 27c not facing the read gate 45a of the pixel 3a of the second pixel column P2, among the four set of two oblique sides 27c and 27d opposite to the side where the first separation region 47a is formed, and a third separation region 47c is formed along the oblique side 27d where the second read gate 45b is not formed.

An n-type conductive layer 31b is formed in the semiconductor substrate 1 along the upper left oblique side 27a of the pixel 3a of the second pixel column P2. An n-type conductive layer 31a is formed in the semiconductor substrate 1 along the upper right oblique side 27c of the pixel 3b.

The n-type conductive layers 31a and 31b are coupled together to form the vertical charge transfer path 5 extending in a zigzag shape or weaving shape in the vertical direction toward the horizontal charge transfer path.

The vertical charge transfer electrode 11-10 extends in the horizontal direction in a zigzag way along the right and left lower oblique sides 27b and 27d of a plurality of pixels 3a constituting a first pixel row Q1. The four sides of each of these pixels 3a constituting the first pixel row Q1 are surrounded by the vertical charge transfer electrodes 11-9 and 11-10.

As shown in FIG. 2B, a p-type deep well 43 is formed in the semiconductor substrate 1, and formed in this p-type well 43 are the photodiode 41, vertical charge transfer path 31a, transfer gate 45 and separation region 47.

The vertical charge transfer electrode 11 (11-10) is formed over the region where the vertical charge transfer path 31a is formed.

Color filters CF are formed over the semiconductor substrate 1, with a planarizing film H being interposed therebetween.

Micro lenses ML made of photoresist are formed on the color filters CF. The micro lens ML converges light onto the surface of the photodiode 41.

In FIG. 2A, although the read gate 45 is formed along the oblique side facing the vertical charge transfer path among the upper two oblique sides, it may be formed along the oblique side facing the vertical charge transfer path among the lower two oblique sides.

Figure 3:
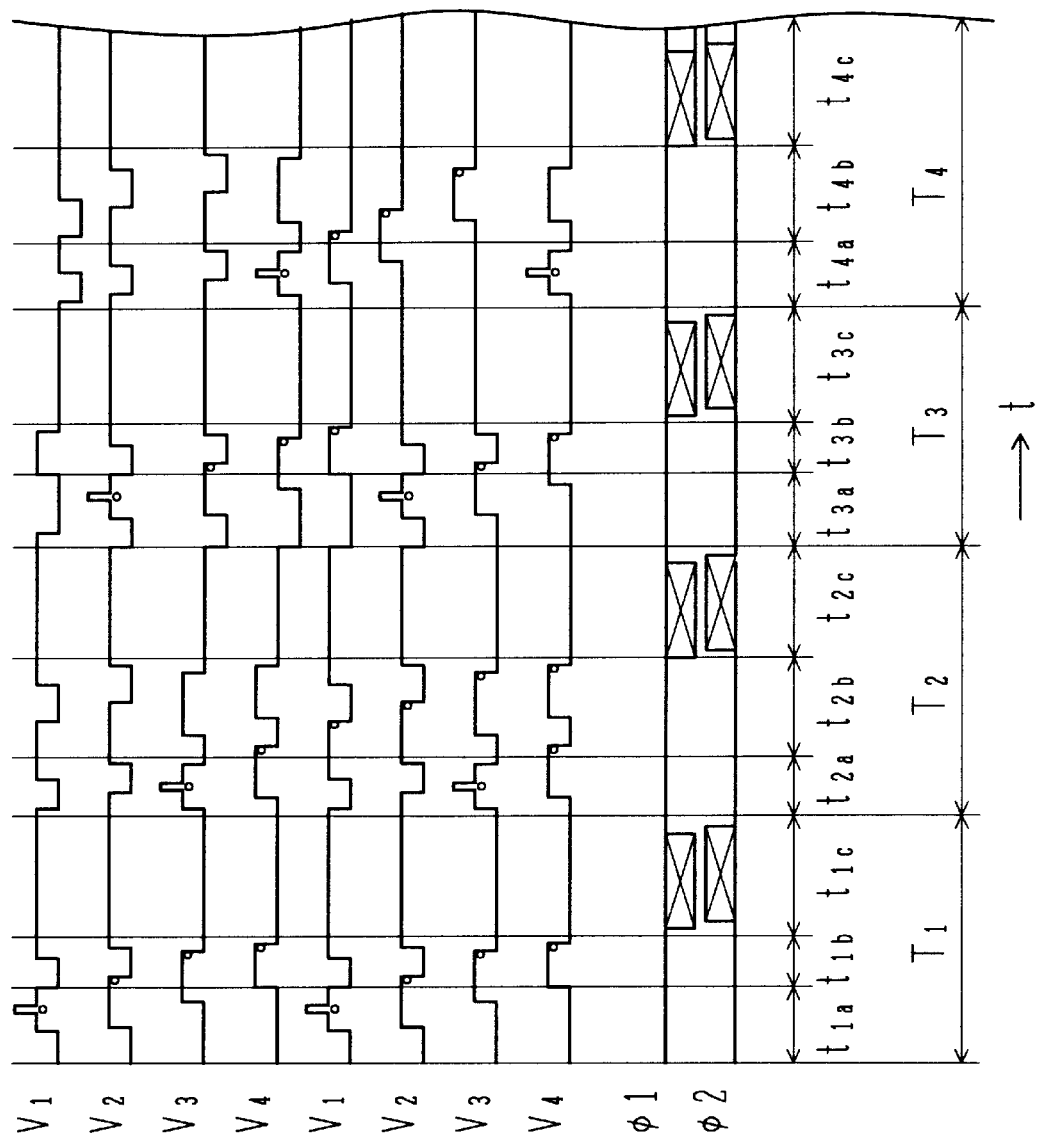
FIG. 3 is a timing chart illustrating the operation of the solid state image pickup device shown in FIG. 1.

With reference to the timing chart shown in FIG. 3, a method of controlling the solid state image pickup device according to the embodiment will be described by referring to the plan view of FIG. 1 when necessary.

A method of reading signals of four fields by applying read pulses will be described.

First, signals of the first field are read during a $T_1$ period.

During a $t_{1a}$ period, a plus voltage, e.g., 8 V, is applied to the electrodes (V1) connected to corresponding photodiodes, in this example, to the vertical charge transfer electrodes 11-1, 11-5 and 11-9, and then a large pulse voltage, e.g., 15 V, is applied.

With the read pulse, the potential barrier of the transfer gate 45 disappears and electric charges stored in the photodiodes 41 of the pixels 3a are read via the read transfer gates 45 to the vertical charge transfer paths 5.

Signal charges read to the vertical charge transfer path 5 are sequentially transferred in the vertical charge transfer path 5 during a $t_{1b}$ period by the four-phase driving method using V1 to V4. At each predetermined timing, pixel signals of one row are transferred from the vertical charge transfer paths 5 to the horizontal charge transfer path 7.

The signal charges transferred to the horizontal charge transfer path 7 are transferred in the horizontal direction during a $t_{1c}$ period by the two-phase driving voltages φ1 and φ2 applied to the horizontal charge transfer electrodes 15. The signal generated by the transferred charges is amplified by the amplifier 17 and read to the external. The read pixel signal corresponds to green (G) pixels.

Next, signals of the second field are read during a $T_2$ period.

During a $t_{2a}$ period, a plus voltage, e.g., 8 V, is applied to the electrodes (V3) connected to corresponding photodiodes, in this example, to the vertical charge transfer electrodes 11-3, 11-7 and 11-11, and then a large pulse voltage, e.g., 15 V, is applied.

With the read pulse, the potential barrier of the transfer gate 45 disappears and electric charges stored in the pixels 3a are read via the read transfer gates 45 to the vertical charge transfer paths 5.

Signal charges read to the vertical charge transfer path 5 are sequentially transferred in the vertical charge transfer path 5 during a $t_{2b}$ period by the four-phase driving method using V1 to V4. At each predetermined timing, pixel signals of one row are transferred from the vertical charge transfer paths 5 to the horizontal charge transfer path 7.

The signal charges transferred to the horizontal charge transfer path 7 are transferred in the horizontal direction during a $t_{2c}$ period by the two-phase driving voltages φ1 and φ2 applied to the horizontal charge transfer electrodes 15. The signal generated by the transferred charges is amplified by the amplifier 17 (FIG. 1) and read to the external. The reed pixel signal corresponds to green (G) pixels.

Next, signal charges of pixels in the third and fourth fields are read during $T_3$ ($t_{3a}$, $t_{3b}$, $t_{3c}$) and $T_4$ ($t_{4a}$, $t_{4b}$, $t_{4c}$) periods by the method similar to the method of transferring and reading signal charges of the first and second fields. Signal charges of pixels of red (R) and blue (B) are therefore read.

By reading the electric charges of the first to fourth fields, the information of all pixels in the pixel area B shown in FIG. 1 can be read.

In this embodiment of the method of reading pixel data from the solid state image pickup device, although a GG/RB alternate filter array is used, other color filter arrays may also be used.

The solid state image pickup device of the first embodiment uses one vertical charge transfer path in common for adjacent two pixel columns.

Therefore, the number of stages of horizontal CCDs connected to the vertical charge transfer paths is a half of the number of photodiodes of pixels in one row. It is possible to make large a pitch of horizontal charge transfer electrodes and pattern the electrodes at a low pattering precision. The manufacture yield of solid state image pickup devices can be improved.

Figure 4:
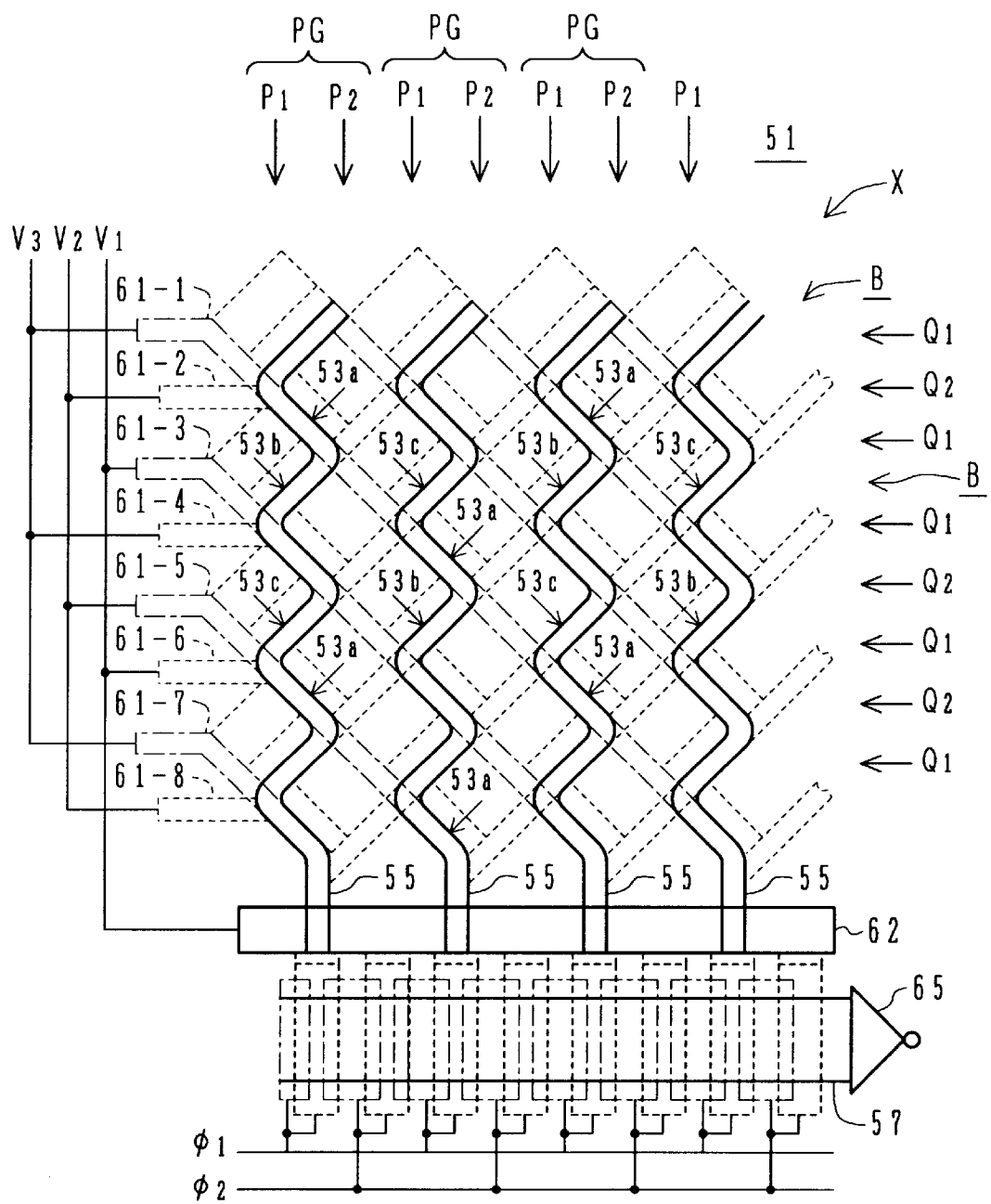
FIG. 4 is a plan view of a solid state image pickup device according to a modification of the first embodiment.

FIG. 4 is a plan view of a solid image pickup device capable of reading pixel data of three fields according to a modification of the first embodiment.

A solid image pickup device X has approximately the same structure as the solid image pickup device A of the first embodiment.

The solid state image pickup device X includes: a pixel area B in which a plurality of pixels 53 (53a, 53b, 53c) are regularly disposed on a semiconductor substrate 51; vertical charge transfer paths 55 disposed in the pixel area B for transferring electric charges in the pixels 53 in a vertical direction; a horizontal charge transfer path 57 disposed under the pixel area B for transferring electric charges transferred from the vertical charge transfer paths 55 in a horizontal direction; and an amplifier 65 for amplifying electric charges transferred from the horizontal charge transfer path 57.

The structure of the pixel area B realizes a so-called pixel shifted solid state image pickup device similar to the solid state image pickup device A of the first embodiment. Similar to the solid image pickup device of the first embodiment, the pixel 53 is of generally a square shape.

The four sides of each pixel 53 are surrounded by two vertical charge transfer electrodes 61 adjacent in the vertical direction.

A voltage V3 is applied to vertical charge transfer electrodes 61-1, 61-4 and 61-7, a voltage V2 is applied to vertical charge transfer electrodes 61-2, 61-5 and 61-8, and a voltage V1 is applied to vertical charge transfer electrodes 61-3, 61-6 and 62, realizing a so-called three-phase driving method.

Figure 5:
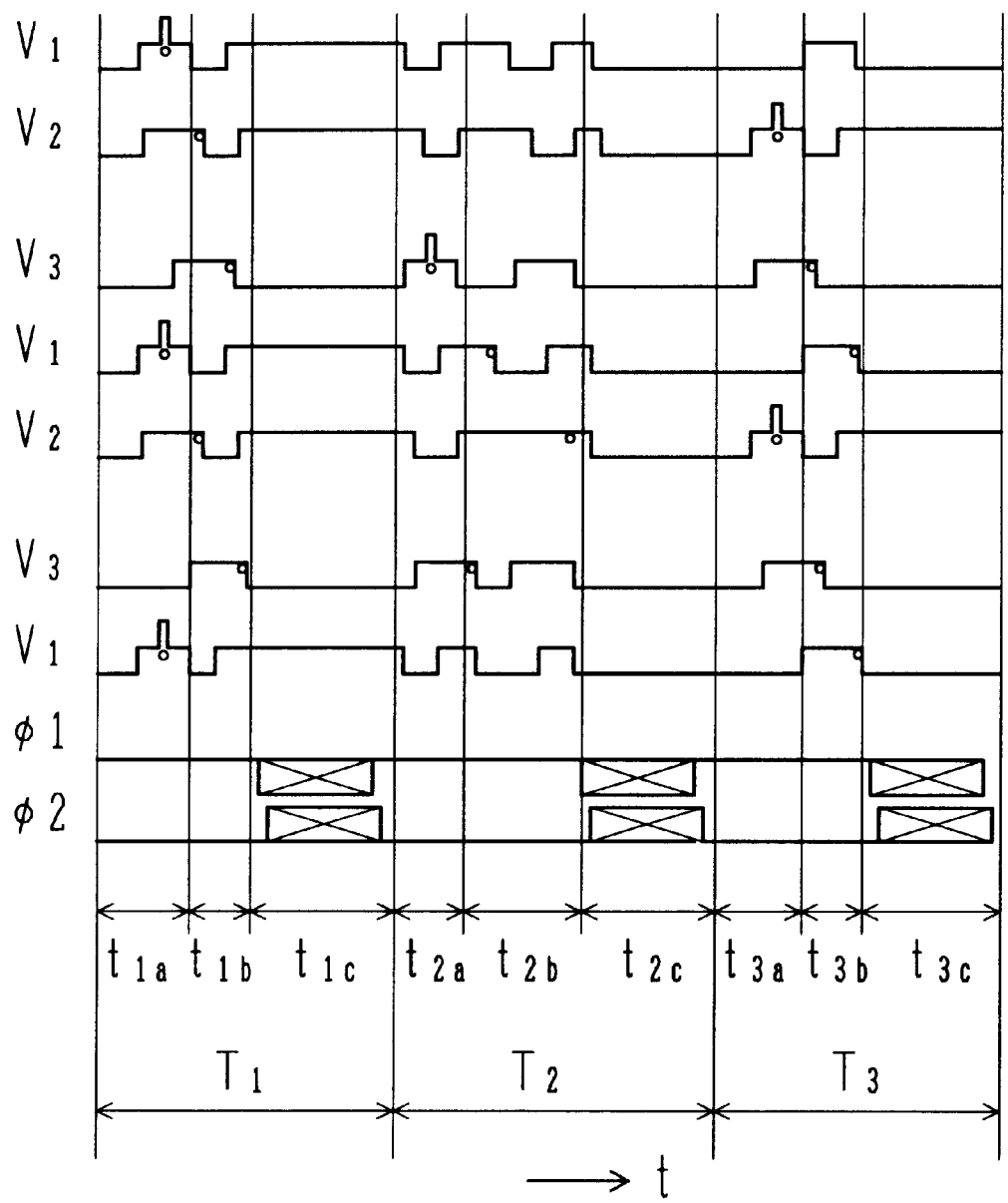
FIG. 5 is a timing chart illustrating the operation of the solid state image pickup device shown in FIG. 4.

With reference to the timing chart shown in FIG. 5, the operation of the solid state image pickup device X will be described.

First, electric charges of the first field are read during a $T_1$ period.

During a $t_{1a}$ period, a plus voltage, e.g., 8 V, is applied to the electrodes (V1) to the vertical charge transfer electrodes 61-3 and 61-6, and then a charge read pulse signal is applied. Electric charges corresponding to red (R) and blue (B) are therefore transferred to the vertical charge transfer paths 55.

Signal charges read to the vertical charge transfer path 5 are sequentially transferred in the vertical charge transfer path 5 during a $t_{1b}$ period by the three-phase driving method using V1 to V3. At each predetermined timing, pixel signals of one row are transferred from the vertical charge transfer paths 55 to the horizontal charge transfer path 57.

After the electric charges are transferred to the horizontal charge transfer path, the electric charges are transferred in the horizontal charge transfer path toward the amplifier 65 during a $t_{1c}$ period by the two-phase driving voltages φ1 and φ2. The pixel signal is output via the amplifier 65 to the external.

In a similar manner, signal charges of the second and third fields are read during $T_2$ ($t_{2a}$, $t_{2b}$, $t_{2c}$) and $T_3$ ($t_{3a}$, $t_{3b}$, $t_{3c}$) periods.

By reading the electric charges of the first to third fields, the information of all pixels in the pixel area can be read.

In the solid state image pickup device X, a group of pixels in the two pixel columns shares one vertical charge transfer path 55.

Therefore, the number of stages of horizontal CCDs connected to the vertical charge transfer paths is a half of the number of photodiodes of pixels in one row. It is possible to pattern the electrodes at a low pattering precision. The manufacture yield of solid state image pickup devices can be improved.

Although the shape of the pixel of the solid state image pickup device is of generally the square shape, other polygonal shapes may be used such as a rectangle and a regular hexagon.

It is apparent that various modifications, improvements, combinations, and the like can be made by those skilled in the art.

Next, the second embodiment of the invention will be described. In the solid state image pickup device of the second embodiment, color signals are added to display a moving image to be monitored.

Figure 6:
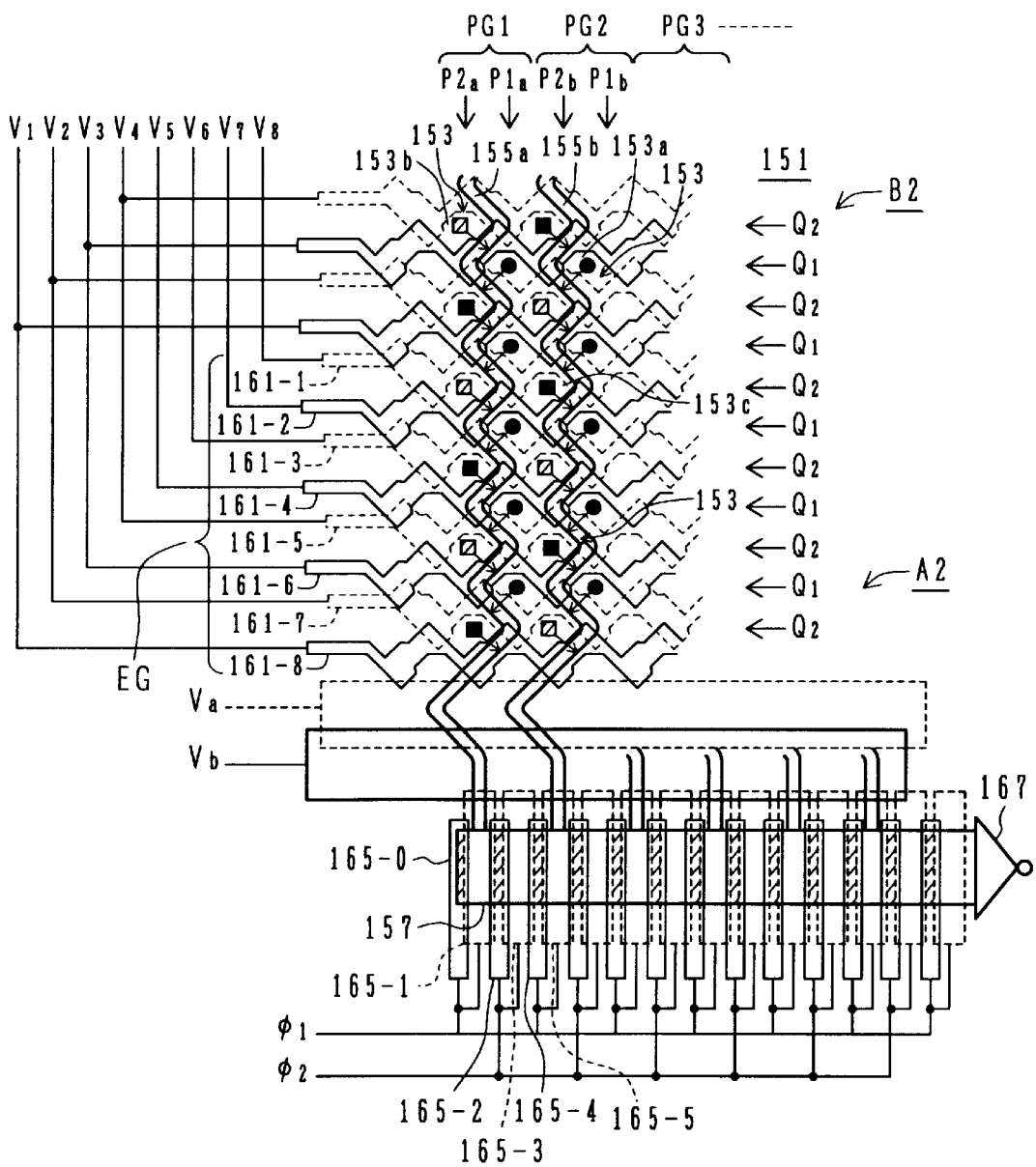
FIG. 6 is a plan view of a solid state image pickup device according to a second embodiment of the invention.

FIG. 6 is a plan view of a solid state image pickup device according to the second embodiment of the invention.

A solid state image pickup device A2 includes: a pixel area B2 in which a plurality of pixels 153 are regularly disposed on a semiconductor substrate 151; vertical charge transfer paths 155 disposed in the pixel area B2 for transferring electric charges in the pixels 153 in a vertical direction; a horizontal charge transfer path 157 disposed under the pixel area B for transferring electric charges transferred from the vertical charge transfer paths 155 in a horizontal direction; and an output amplifier 167 for amplifying electric charges transferred from the horizontal charge transfer path 157.

In the pixel area B2, a plurality of pixels 153 are disposed on a two-dimensional plane of the semiconductor substrate 151 in the horizontal (row) and vertical (column) directions. One pixel and adjacent pixel are disposed shifted by a half pitch in the vertical direction, to thereby constitute a so-called pixel shifted solid state image pickup device.

Each pixel is of generally the square shape. Pixels are disposed so that diagonal lines of squares are regularly disposed in the vertical and horizontal directions.

Pixels regularly disposed in the vertical direction are called pixel columns.

A plurality of green pixels 153a regularly disposed in the vertical direction constitute a first pixel column P1a. A plurality of pixels regularly disposed in the vertical direction and being adjacent to the first pixel column P1a in the horizontal direction constitute a second pixel column P2a. Blue pixels 153b and red pixels 153c are alternately disposed in the vertical direction to form the second pixel column P2a.

The first pixel column P1a and the second pixel column P2a adjacent to the first pixel column P1a in the horizontal direction constitute one pixel group PG. A plurality of pixel groups PG1, PG2, PG3, . . . are disposed adjacent to each other in the horizontal direction to form the pixel area B2.

In FIG. 6, although only two pixel groups PG1 and PG2 are shown for the simplicity of drawing, a number of pixel groups are actually formed.

The vertical charge transfer path 155 (155a, 155b) (indicated by solid lines in FIG. 6) made of n-type semiconductor layers in the semiconductor substrate 151 is of a zigzag shape or a weaving shape extending along a space formed between, for example, the first and second pixel columns P1a and P2a of the first pixel group PG1. The vertical charge transfer path 155 is not formed between pixel groups PG. Namely, the vertical charge transfer path 155 is not formed between the pixel groups PG1 and PG2 adjacent in the horizontal direction. Pixels regularly disposed in the horizontal direction are called pixel rows.

Referring to FIG. 6, a vertical charge transfer electrode, e.g., a vertical charge transfer electrode 161-1 (indicated by broken lines) extends in the horizontal direction in a weaving shape or zigzag shape along sets of two oblique lines under a first pixel row Q1 constituted of the green pixels 153a.

A vertical charge transfer electrode 161-2 (indicated by solid lines) extends in the horizontal direction in a weaving shape or zigzag shape along sets of two oblique lines under a second pixel row Q1 constituted of blue and red pixels 153b and 153c regularly and alternately disposed in the horizontal direction.

Eight vertical charge transfer electrodes 161-1 to 161-8 constitute one electrode group EG. Although only one electrode group is shown in FIG. 6, a number of electrode groups EG are actually formed in the pixel area B2.

Different voltages V8 to V1 can be applied from a driver circuit to a set of eight vertical charge transfer electrodes 161-1 to 161-8.

Between the horizontal charge transfer path 157 and the last stage vertical charge transfer electrode 161-8 on the side of the horizontal charge transfer path 157 among the vertical charge transfer electrodes 161, two transfer electrodes Va and Vb adjacent in the vertical direction and extending in the horizontal direction are formed. By using two transfer electrodes Va and Vb, electric charges are transferred from the vertical charge transfer paths 155 to the horizontal charge transfer path 157.

The transfer electrodes Va and Vb may be used as desired and the number of transfer electrodes is not limited only to two.

The horizontal charge transfer path 157 is formed at one ends of the vertical charge transfer paths 155. A plurality of horizontal charge transfer electrodes 165 made of first and second polysilicon layers are formed along the horizontal charge transfer path 157. Horizontal charge transfer electrodes 165-0 and 165-1 are connected together and applied with a voltage φ1. Horizontal charge transfer electrodes 165-2 and 165-3 are connected together and applied with a voltage φ2. Horizontal charge transfer electrodes 165-4 and 165-5 are connected together and applied with the voltage φ1.

Between two vertical charge transfer paths 155 adjacent in the horizontal direction, four horizontal charge transfer electrodes (in the example, shown in FIG. 6, electrodes 165-1 to 165-4) are disposed.

B (blue), R (red), B, R, B and R are disposed in the vertical direction in the pixel column P2a in this order from the uppermost. G (green), G, G, G, G and G are disposed in the vertical direction in the pixel column P1a in this order from the uppermost.

R (red), B (blue), R, B, R and B are disposed in the vertical direction in the pixel column P2b in this order from the uppermost. G (green), G, G, G, G and G are disposed in the vertical direction in the pixel column P1b in this order from the uppermost.

The color array shown in FIG. 6 is called a perfect G stripe RB checkered pattern.

As shown in FIG. 6, each pixel is of generally a rhomboid shape having four oblique sides.

Pixels of the first pixel columns P1a and P1b are disposed in spaces between rows and columns formed by the pixels 3c, 3b, 3c, . . . of the second pixel columns P2a and P2b.

As the drawing of FIG. 6 is rotated by 45 degrees, pixels of the first and second pixel columns P1 and P2 constitute generally a square matrix. In FIG. 6, a read gate is formed along a lower oblique side facing the vertical charge transfer path 155a, 155b among the four oblique sides of each pixel.

Figure 7A:
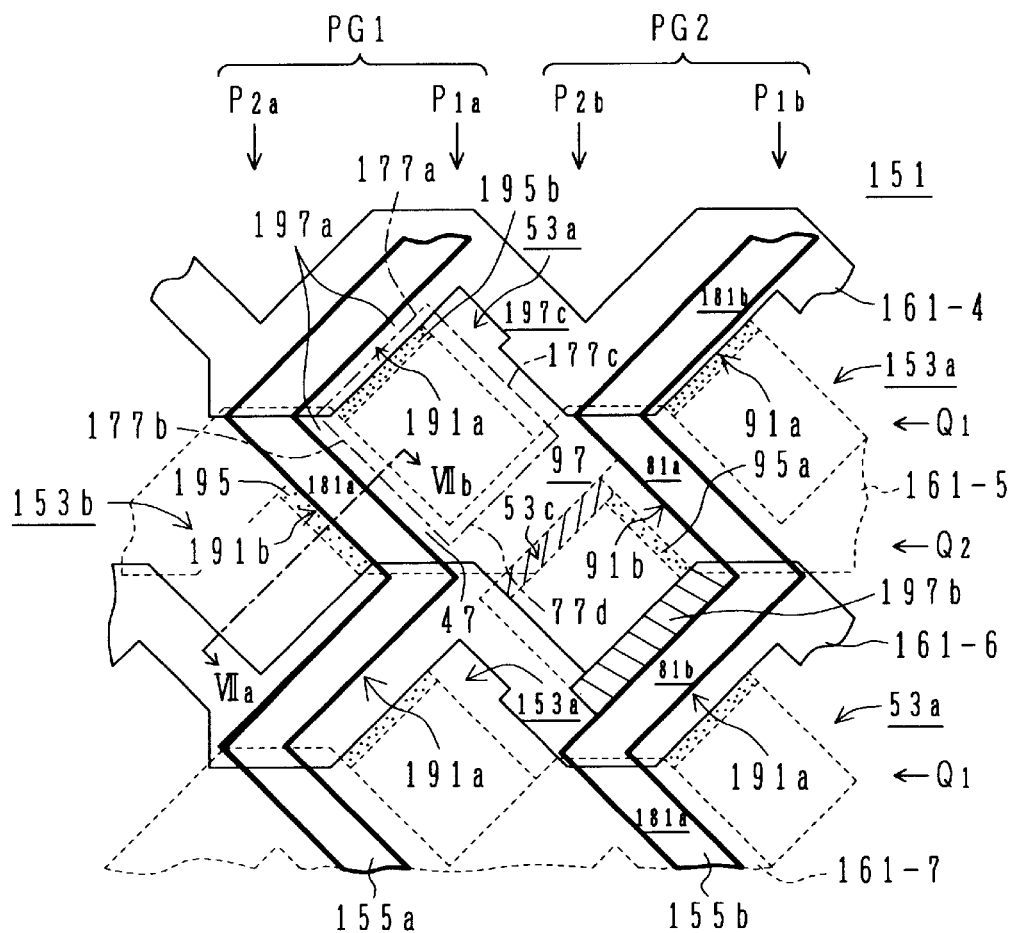
FIG. 7A is an enlarge view showing the detailed structure of a pixel area of a solid state image pickup device similar to that shown in FIG. 6.
Figure 7B:
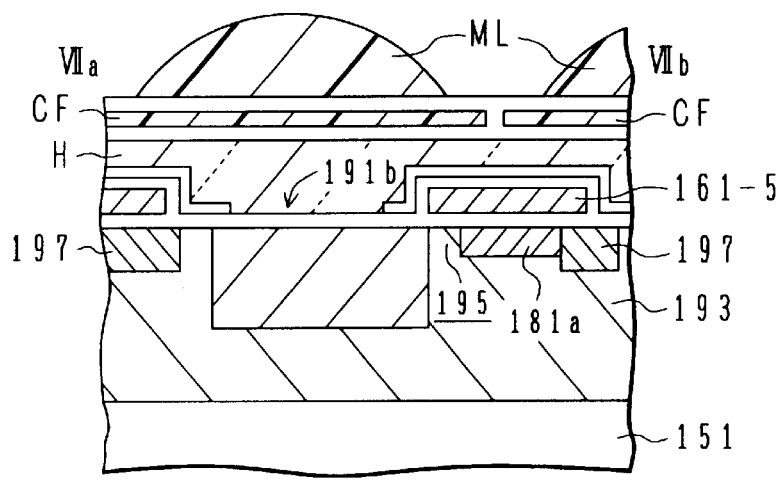
FIG. 7B is a cross sectional view taken along line VIIa-VIIb of FIG. 7A.

FIGS. 7A and 7B show the main part of the solid state image pickup device shown in FIG. 6. FIG. 7A is a plan view and FIG. 7B is a cross sectional view taken along line VIIa-VIIb of FIG. 7A. In FIGS. 7A and 7B, for the convenience of drawing, the read gate is formed along an upper oblique side facing the vertical charge transfer path 155a, 155b among the four oblique sides of each pixel. The description for FIGS. 7A and 7B is given based upon the array shown in FIG. 6.

As shown in FIG. 7A, the pixel 153 (153a, 153b, 153c) is of generally a square shape. Of the four vertices of the square, opposing two vertices of the pixels are generally and regularly disposed in the vertical and horizontal directions. Oblique sides (imaginary lines) coupling the four vertices and extending in a direction of right/left symmetry are called two oblique sides 177a and 177b and two oblique sides 177c and 177d.

In an area surrounded by the four oblique sides 177a, 177b, 177c and 177d of the pixel 153, a photoelectric conversion element (photodiode) 191 (191a, 191b, 191c) is disposed. A transfer gate 195 is formed between a light reception area 191a of the photodiode 191 and the n-type semiconductor layer 181a, 181b partially forming the vertical charge transfer path 155. A transfer gate 195 is formed, for example, along the oblique side 177a of the pixel 153a. First to third separation regions 197 made of high concentration p-type semiconductor layers are formed along the other three oblique sides 177b, 177c and 177d.

More specifically, the first separation region 197a is formed along the first set of two left oblique sides 177a and 177b among the four oblique sides 177a to 177d of the pixel 153c in the first pixel column P1.

A first read gate 195a is formed near the vertical charge transfer path 181 along the upper oblique side 177c of the second set of two oblique sides 177c and 177d opposite to the side where the first separation region 197c is formed, and the second separation region 197b is formed along the oblique side 177d where the first read gate 195a is not formed.

The first separation region 197a is formed along the third set of two oblique sides 177a and 177b on the opposite side of the first pixel column P1, among the four oblique sides 177a to 177d of the pixel 153b.

The third separation region 197c is formed along the oblique side 177c not facing the read gate 195c of the pixel 153a of the first pixel column P1, among the fourth set of two oblique sides 177c and 177d on the opposite side of the first separation region 197a.

An n-type conductive layer 181a is formed in the semiconductor substrate 151 along the lower left oblique side 177b of the pixel 153a of the second pixel column P2. An n-type conductive layer 181b is formed in the semiconductor substrate 151 along the upper left oblique side 177a of the pixel 153a.

The n-type conductive layers 181a and 181b are coupled together to form the vertical charge transfer path 155 extending in a weaving shape or zigzag shape in the vertical direction toward the horizontal charge transfer path.

The vertical charge transfer electrode 165-5 extends in the horizontal direction in a weaving shape along the right and left lower oblique sides 177b and 177d of a plurality of pixels 153a constituting a first pixel row Q1. The vertical charge transfer electrodes 161-4 and 161-5 extend in the horizontal direction in a weaving shape along the four sides of a plurality of pixels 153a constituting the first pixel row Q1.

As shown in FIG. 7B, a p-type deep well 193 is formed in the semiconductor substrate 151, and formed in this p-type well 193 are the photodiode 191, vertical charge transfer path 181a, transfer gate 195 and separation region 197.

The vertical charge transfer electrode 161-5 is formed over the region where the vertical charge transfer path 181a is formed.

Color filters CF are formed over the semiconductor substrate 151, with a planarizing film H being interposed therebetween.

Micro lenses ML made of, for example, photoresist, are formed on the color filters CF. The micro lens ML converges light onto the surface of the photodiode 191.

With reference to the timing charts shown in FIGS. 8 to 15, the method of controlling the solid state image pickup device A2 of this embodiment will be described, and the operation of this device will be described with reference to the array shown in FIG. 6 (the read gate being formed along the lower oblique side).

An operation of reading all pixels after a still image is picked up will be described with reference to the timing charts shown in FIGS. 8 to 11.

Figure 8:
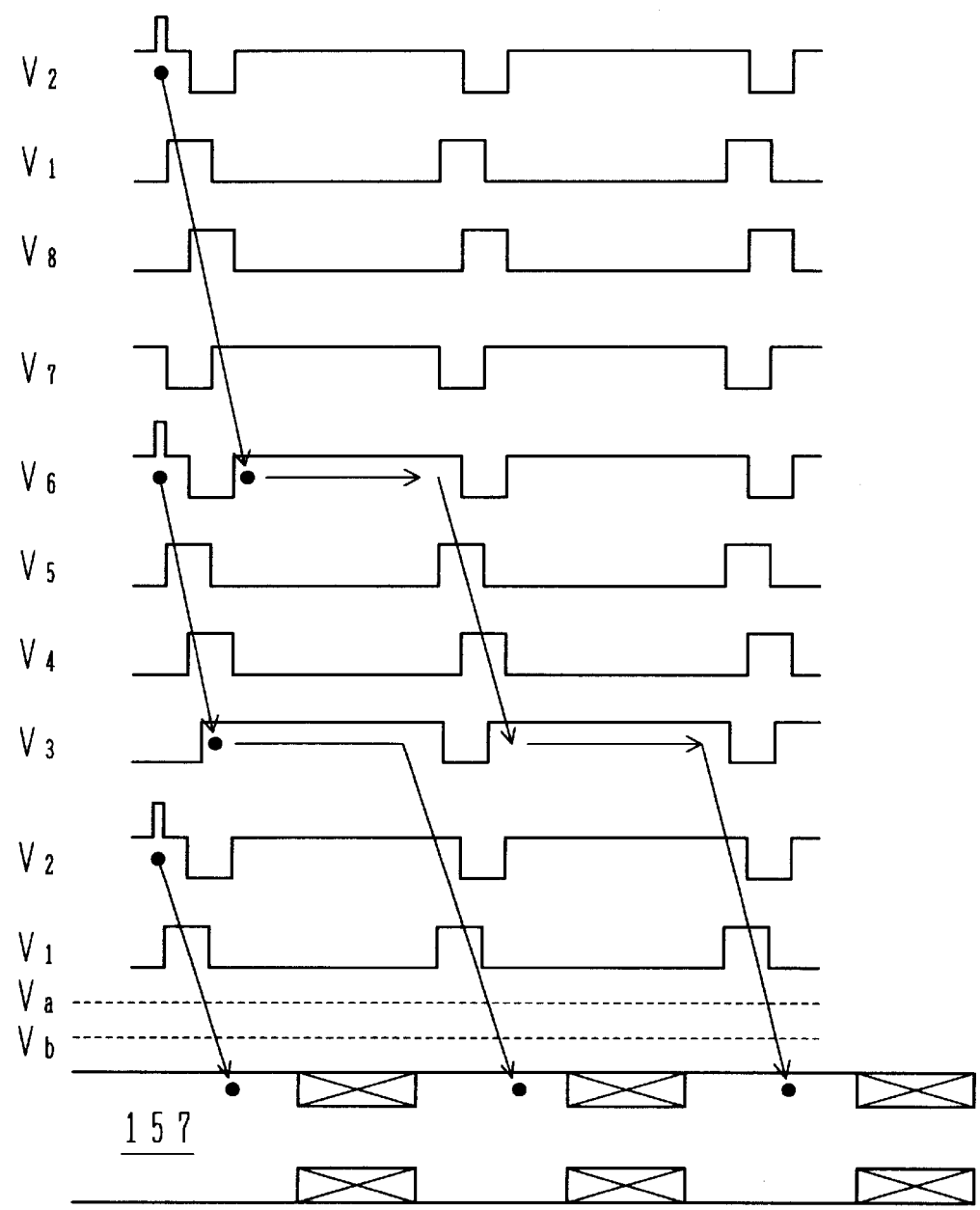
FIG. 8 is a timing chart illustrating the operation of reading a still image taken with the solid state image pickup device shown in FIG. 6.

As shown in FIG. 8, a high pulse voltage is applied as a read voltage to the vertical charge transfer electrode 161-7 (V2) and vertical charge transfer electrode 161-3 (V6). This read voltage is, for example, 15 V. Electric charges for green color (hereinafter called "G charges") are read as indicated by arrows from the photodiodes 153a to the vertical charge transfer path 155 under the vertical charge transfer electrode 161-7 and to the vertical charge transfer path 155 under the vertical charge transfer electrode 161-3. In FIG. 6 and the timing charts shown in FIGS. 8 to 11, G charges are represented by a solid black circle.

The G charges read to the vertical charge transfer path 155 under the vertical charge transfer electrode 161-7 (V2) are transferred to the horizontal charge transfer path 157 by sequentially applying a high voltage of about 8 V to the vertical charge transfer electrode 161-8 (V1), first transfer electrode Va and second transfer electrode Vb.

The G charges read to the vertical charge transfer path 155 under the vertical charge transfer electrode 161-3 (V6) are transferred to the horizontal charge transfer path 157 by sequentially applying a high voltage of about 8 V to the vertical charge transfer electrodes 161-4 (V5) to 161-8 (V1), first transfer electrode Va and second transfer electrode Vb.

The G charges transferred from the vertical charge transfer path 155 to the horizontal charge transfer path 157 are transferred toward the output amplifier 167 by the two-phase driving method. The G signal amplified by the output amplifier 167 is supplied to an external circuit.

Next, the remaining G charges are read.

Figure 9:
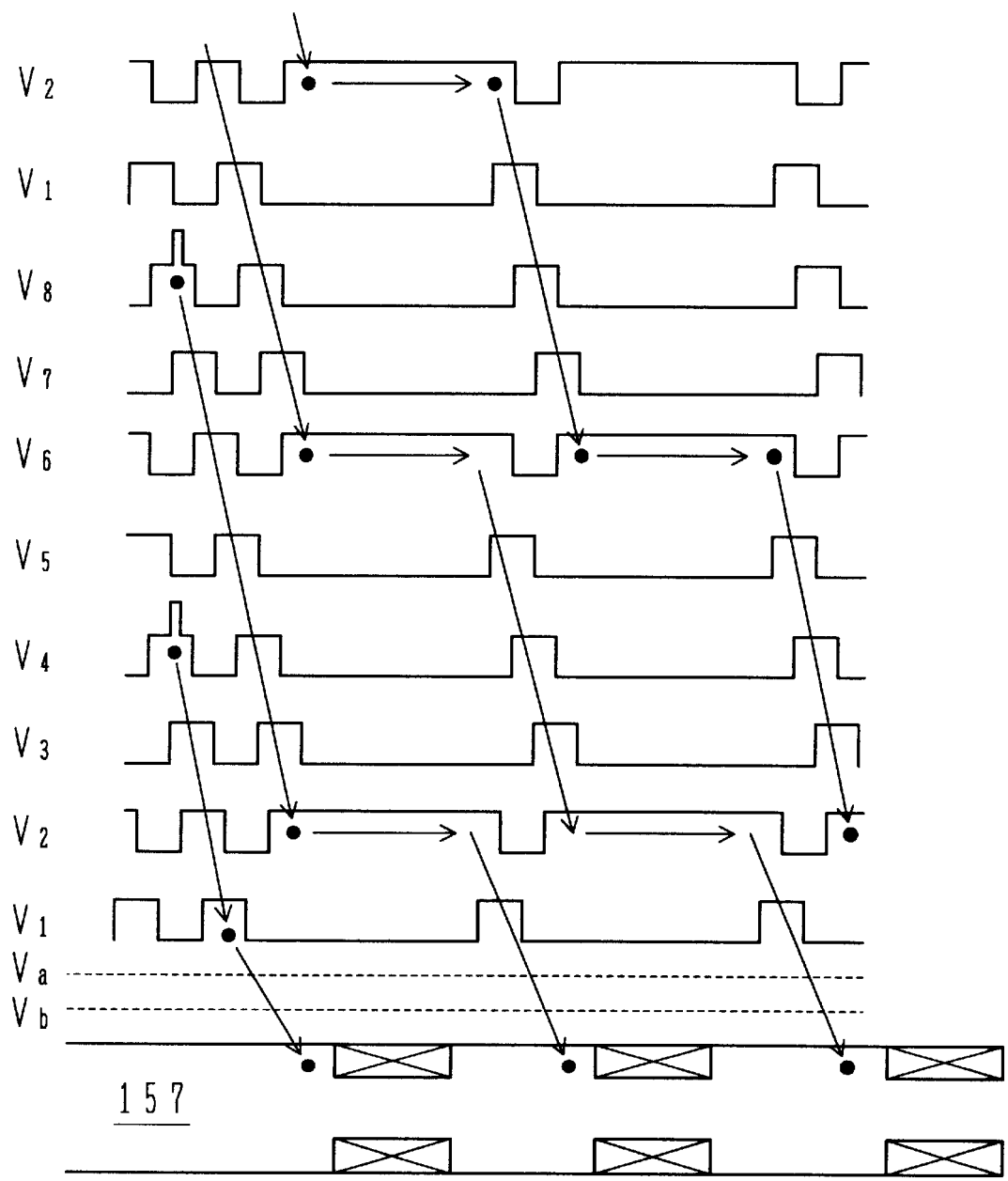
FIG. 9 is a timing chart illustrating the operation of reading a still image taken with the solid state image pickup device shown in FIG. 6.

As shown in FIG. 9, the high pulse voltage is applied as the read voltage to the vertical charge transfer electrode 161-5 (V4) and vertical charge transfer electrode 161-1 (V8). The remaining G charges are therefore read to the vertical charge transfer path 155 as shown by arrows in FIGS. 6 and 9.

The G charges are transferred to the horizontal charge transfer path 157 by the same operation described with FIG. 8.

The G charges transferred to the horizontal charge transfer path 157 are transferred toward the output amplifier 167 by the two-phase driving method. The G signal amplified by the output amplifier 167 is supplied to the external circuit.

The operation of reading the G charges is the same for all pixel groups PG (PG1 and PG2 in FIG. 6) in the horizontal direction.

Next, B and R charges are read.

Figure 10:
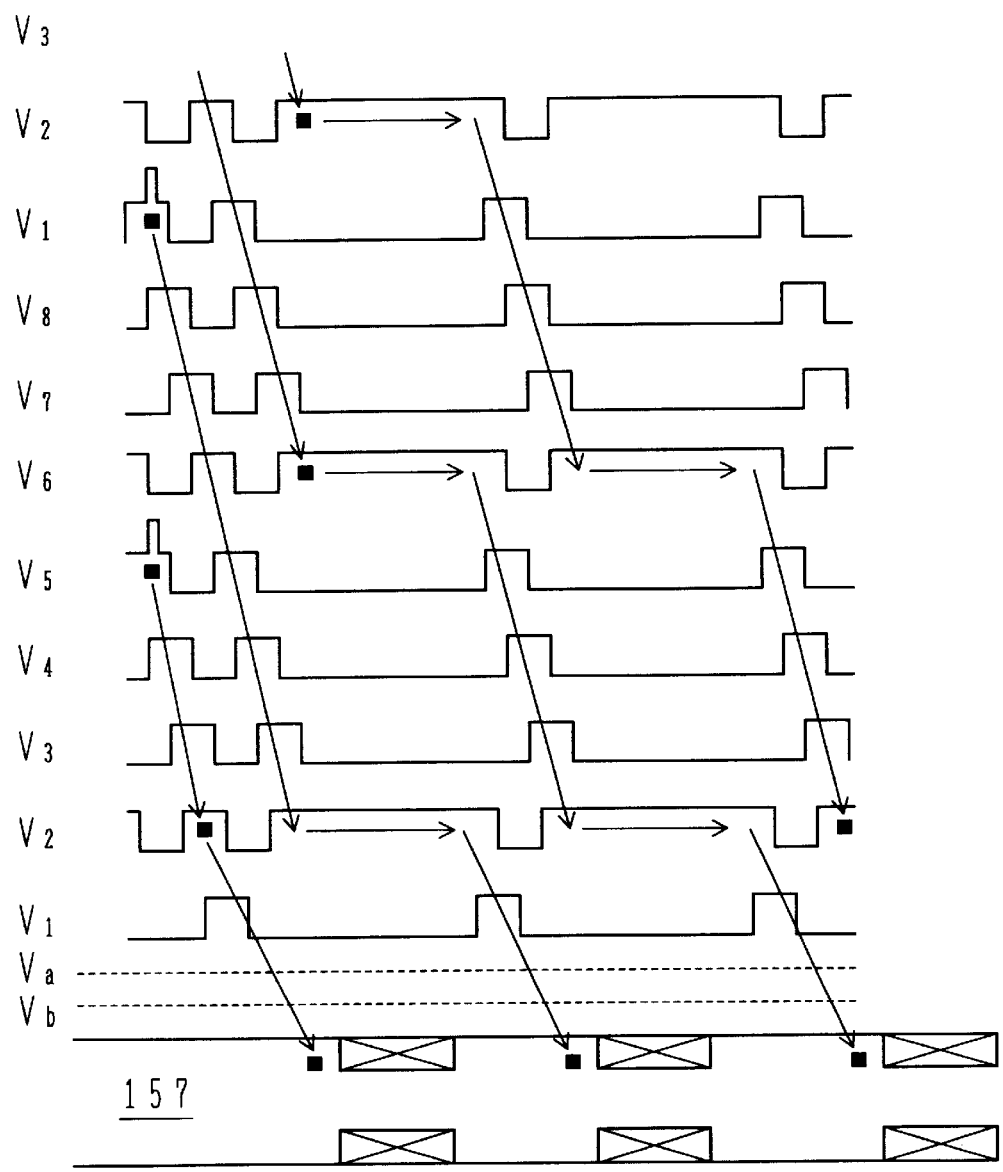
FIG. 10 is a timing chart illustrating the operation of reading a still image taken with the solid state image pickup device shown in FIG. 6.

As shown in FIG. 10, the high pulse voltage is applied as the read voltage to the vertical charge transfer electrode 161-8 (V1) and vertical charge transfer electrode 161-3 (V5). The R charges (represented by a solid black square) are therefore read to the vertical charge transfer path 155a and the B charges (represented by a hatched square) are therefore read to the vertical charge transfer path 155b. FIG. 10 is the timing chart associated with the vertical charge transfer path 155a so that only the R charges are shown and the B charges are read to the vertical charge transfer path 155b.

The R and B charges are supplied to the external circuit by the same operation described with FIG. 8.

Figure 11:
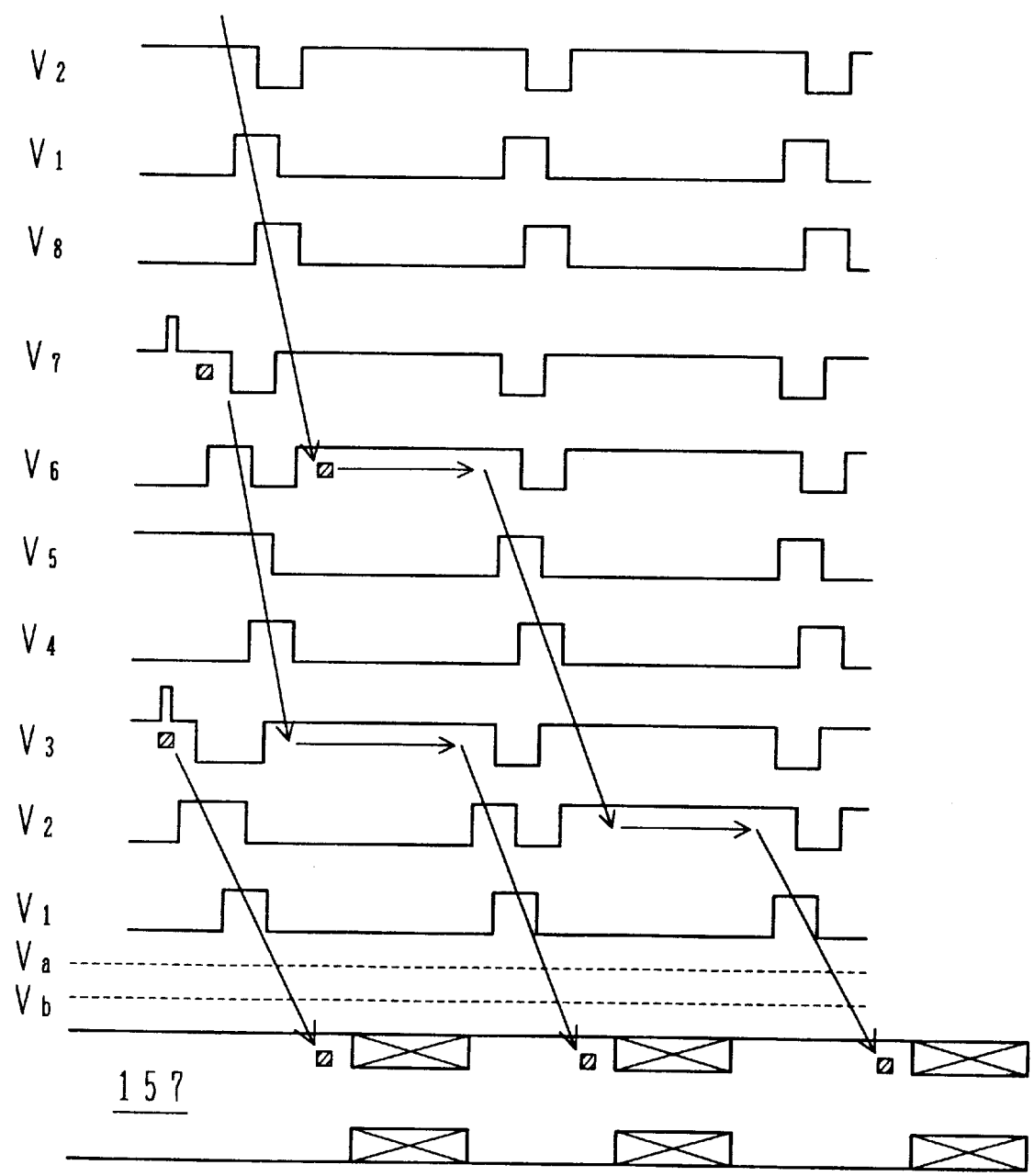
FIG. 11 is a timing chart illustrating the operation of reading a still image taken with the solid state image pickup device shown in FIG. 6.

As shown in FIG. 11, the high pulse voltage is applied as the read voltage to the vertical charge transfer electrode 161-6 (V3) and vertical charge transfer electrode 161-2 (V7). The B charges are therefore read to the vertical charge transfer path 155a and the R charges are therefore read to the vertical charge transfer path 155b. FIG. 11 is the timing chart associated with the vertical charge transfer path 155a so that only the B charges are shown and the R charges are read to the vertical charge transfer path 155b.

The R and B charges are supplied to the external circuit by the same operation described with FIG. 8. With these operations, all pixels can be read and a still image can be reproduced clearly.

Charges are read from pixels by applying read pulses to vertical charge transfer electrodes 161 separated by four electrodes in the vertical direction. The read charges of the same color are transferred to one of the vertical charge transfer paths 155a and 155b.

It is therefore possible to prevent mixture (color mixture) of transferred charges which may be caused if charges of different colors are on the same vertical charge transfer path. Since mixture of transferred charges can be prevented, the solid state image pickup device of this embodiment is hard to degrade the quality of a reproduced image.

A method of reading an image signal in a video mode for reproducing a moving image to be monitored in a digital camera, will be described with reference to FIGS. 12 to 17.

In the video mode, electric charges are not read from all pixels, but electric charges are read only from pixels in second to seventh rows among each pixel column Q constituted of eight rows.

Figure 12:
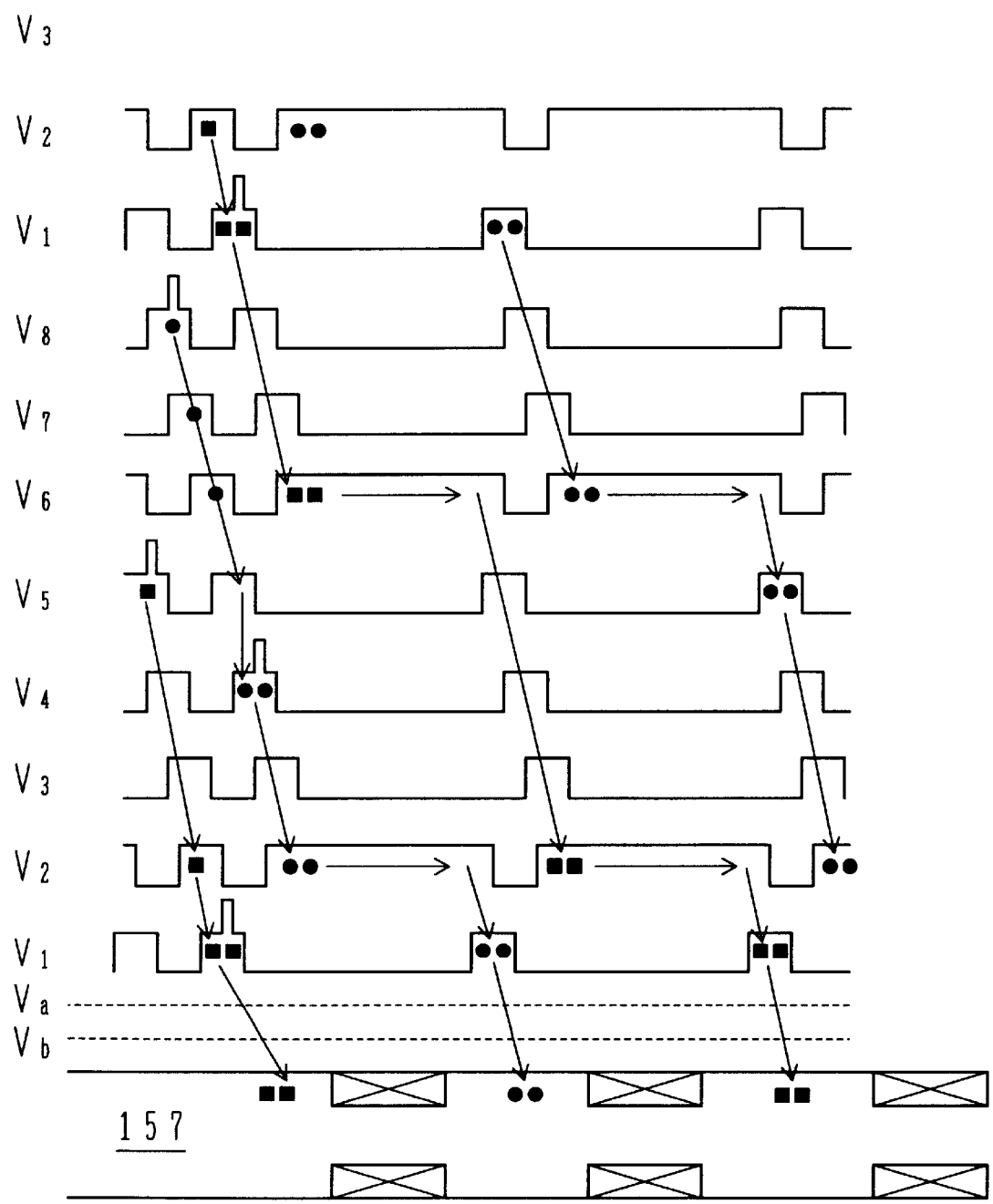
FIG. 12 is a timing chart illustrating the operation of reading a monitor image taken with the solid state image pickup device shown in FIG. 6.
Figure 13:
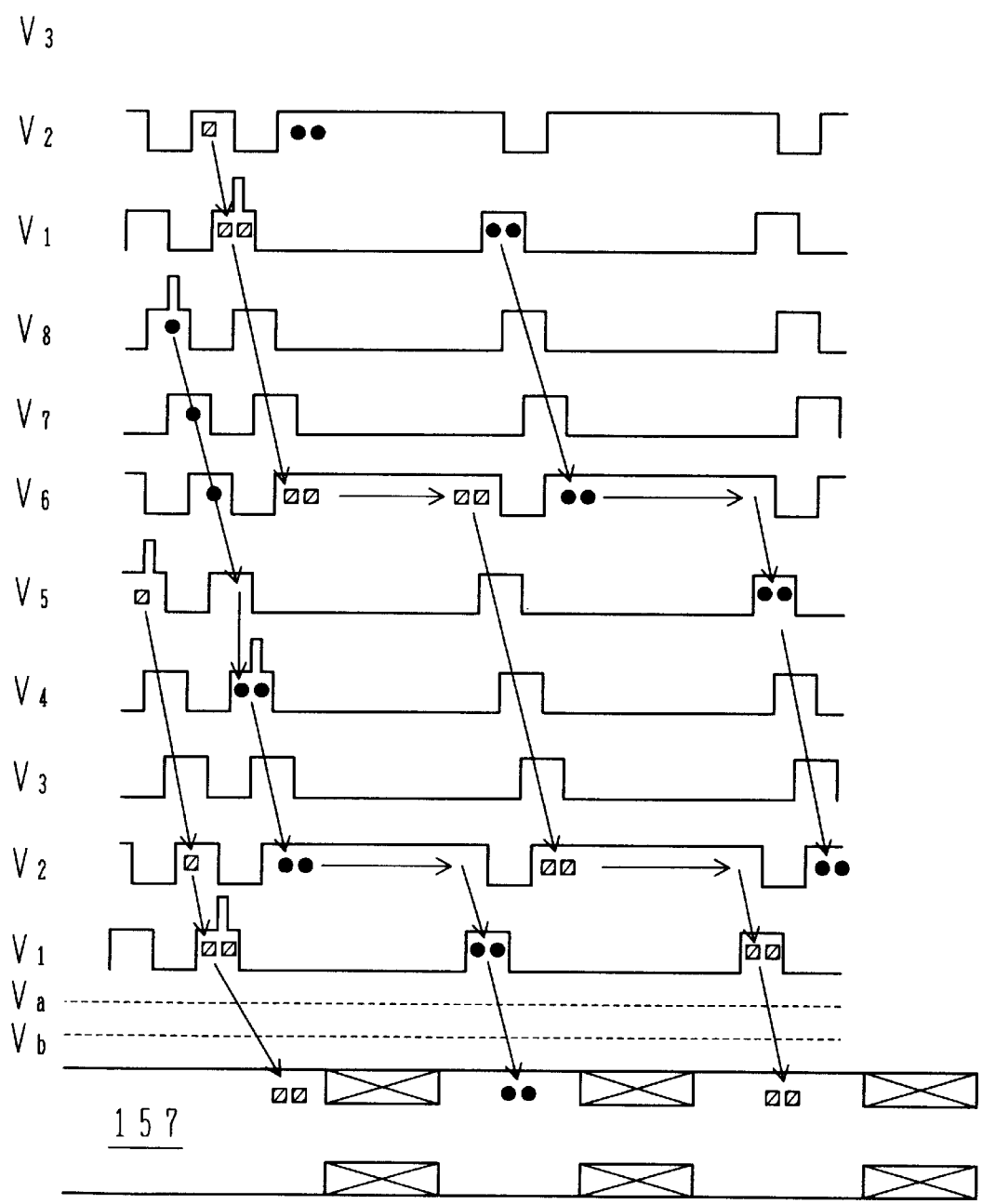
FIG. 13 is a timing chart illustrating the operation of reading a monitor image taken with the solid state image pickup device shown in FIG. 6.
Figure 14:
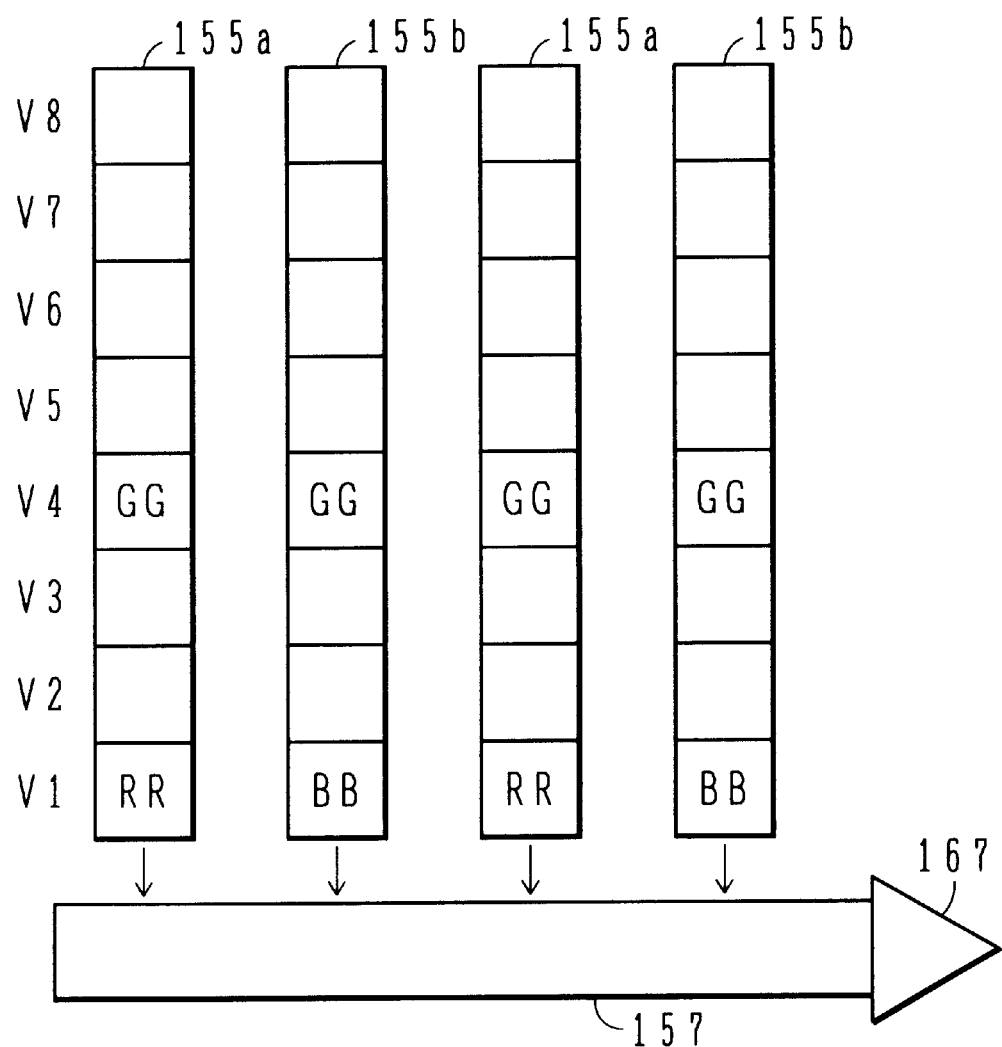
FIG. 14 is a diagram showing the positions of color signals on the vertical charge transfer paths during the operation of reading a monitor image taken with the solid state image pickup device shown in FIG. 6.

FIGS. 12 to 14 illustrate a thinning read method which applies the read voltage only to the vertical charge transfer electrodes 161-8 (V1) and 161-1 (V8) and the vertical charge transfer electrodes 161-5 (V4) and 161-4 (V5).

As shown in FIG. 12, while a plus voltage, e.g., 8 V, is applied to the electrode V8, a high plus voltage, e.g., 15 V, is applied to the electrode V8 as the read pulse.

G charges are therefore read to the vertical charge transfer path 155a of the pixel group PG1. A plus voltage is sequentially applied to the electrodes 161-1 (V8) to 161-5 (V4) to thereby transfer G charges in the vertical direction. The G charges are therefore stored in the vertical charge transfer path 155a under the electrode 161-5.

In this state, i.e., while the plus voltage, e.g., 8 V, is applied to the electrode V4, a high plus voltage, e.g., 15 V, is applied to the electrode V4 as the read pulse.

G charges are therefore read to the vertical charge transfer path 155a of the pixel group PG1. The G charges are therefore added to the G charges transferred downward in the vertical charge transfer path under the electrode 161-5 (forming a GG signal).

A plus voltage is sequentially applied to the electrodes 161-5 (V4) to 161-8 (V1) to transfer the signal charges of the GG signal.

A plus voltage is applied to the electrodes Va and Vb to transfer the GG signal to the horizontal charge transfer path 157.

While a plus voltage, e.g., 8 V, is applied to the electrode V1, a high plus voltage, e.g., 15 V, is applied to the electrode V1 as the read pulse.

R charges are therefore read to the vertical charge transfer path 155a of the pixel group PG1. A plus voltage is sequentially applied to the electrodes 161-8 (V1) to 161-4 (V5) to thereby transfer R charges in the vertical direction. The R charges are therefore stored in the vertical charge transfer path 155a under the electrode 161-4.

In this state, i.e., while the plus voltage, e.g., 8 V, is applied to the electrode V5, a high plus voltage, e.g., 15 V, is applied to the electrode V5 as the read pulse.

R charges are therefore read to the vertical charge transfer path 155a of the pixel group PG1. The R charges are therefore added to the R charges transferred downward in the vertical charge transfer path under the electrode 161-4 (forming an RR signal).

A plus voltage is sequentially applied to the electrodes 161-5 (V4) to 161-8 (V1) to transfer the signal charges of the RR signal.

A plus voltage is applied to the electrodes Va and Vb to transfer the RR signal to the horizontal charge transfer path 157.

FIG. 13 illustrates a method of reading electric charges from pixels in the pixel group PG2.

While a plus voltage, e.g., 8 V, is applied to the electrode V1, a high plus voltage, e.g., 15 V, is applied to the electrode V1 as the read pulse.

B charges are therefore read to the vertical charge transfer path 155b of the pixel group PG2. A plus voltage is sequentially applied to the electrodes 161-8 (V1) to 161-4 (V5) to thereby transfer B charges in the vertical direction. The B charges are therefore stored in the vertical charge transfer path 155b under the electrode 161-4.

In this state, i.e., while the plus voltage, e.g., 8 V, is applied to the electrode V5, a high plus voltage, e.g., 15 V, is applied to the electrode V5 as the read pulse.

B charges are therefore read to the vertical charge transfer path 155b of the pixel group PG2. The B charges are therefore added to the B charges transferred downward in the vertical charge transfer path 155b under the electrode 161-4 (forming a BB signal).

A plus voltage is sequentially applied to the electrodes 161-4 (V5) to 161-8 (V1) to transfer the signal charges of the BB signal.

A plus voltage is applied to the electrodes Va and Vb to transfer the BB signal to the horizontal charge transfer path 157.

While a plus voltage, e.g., 8 V, is applied to the electrode V8, a high plus voltage, e.g., 15 V, is applied to the electrode V8 as the read pulse.

G charges are therefore read to the vertical charge transfer path 155b of the pixel group PG2. A plus voltage is sequentially applied to the electrodes 161-1 (V8) to 161-5 (V4) to thereby transfer G charges in the vertical direction. The G charges are therefore stored in the vertical charge transfer path 155b under the electrode 161-5.

In this state, i.e., while the plus voltage, e.g., 8 V, is applied to the electrode V4, a high plus voltage, e.g., 15 V, is applied to the electrode V4 as the read pulse.

G charges are therefore read to the vertical charge transfer path 155b of the pixel group PG2. The G charges are therefore added to the G charges transferred downward in the vertical charge transfer path 155b under the electrode 161-5 (forming a GG signal).

A plus voltage is sequentially applied to the electrodes 161-5 (V4) to 161-8 (V1) to transfer the signal charges of the GG signal.

A plus voltage is applied to the electrodes Va and Vb to transfer the GG signal to the horizontal charge transfer path 157.

FIG. 14 shows the layout of electric charges of respective colors read from the photodiodes to the vertical charge transfer paths 155a and 155b by the above-described read method.

The added RR charges are stored in the vertical charge transfer path 155a under the electrode V1. The added GG charges are stored in the vertical charge transfer path 155a under the electrode V4.

The added BB charges are stored in the vertical charge transfer path 155b under the electrode V1. The added GG charges are stored in the vertical charge transfer path 155b under the electrode V4.

The electric charges of RR, BB and GG are stored in other vertical charge transfer paths 155a and 155b in a similar manner.

As described with reference to FIGS. 12 to 14, the solid state image pickup device can display a moving image quickly by reading pixels through thinning.

Moreover, since the signals of the same colors are added, the image pickup sensitivity can be improved and a clear image can be formed.

FIGS. 15 to 18 illustrate a thinning read method which applies the read voltage only to the vertical charge transfer electrodes 161-7 (V2) and 161-6 (V3) and the vertical charge transfer electrodes 161-3 (V6) and 161-2 (V7).

Figure 15:
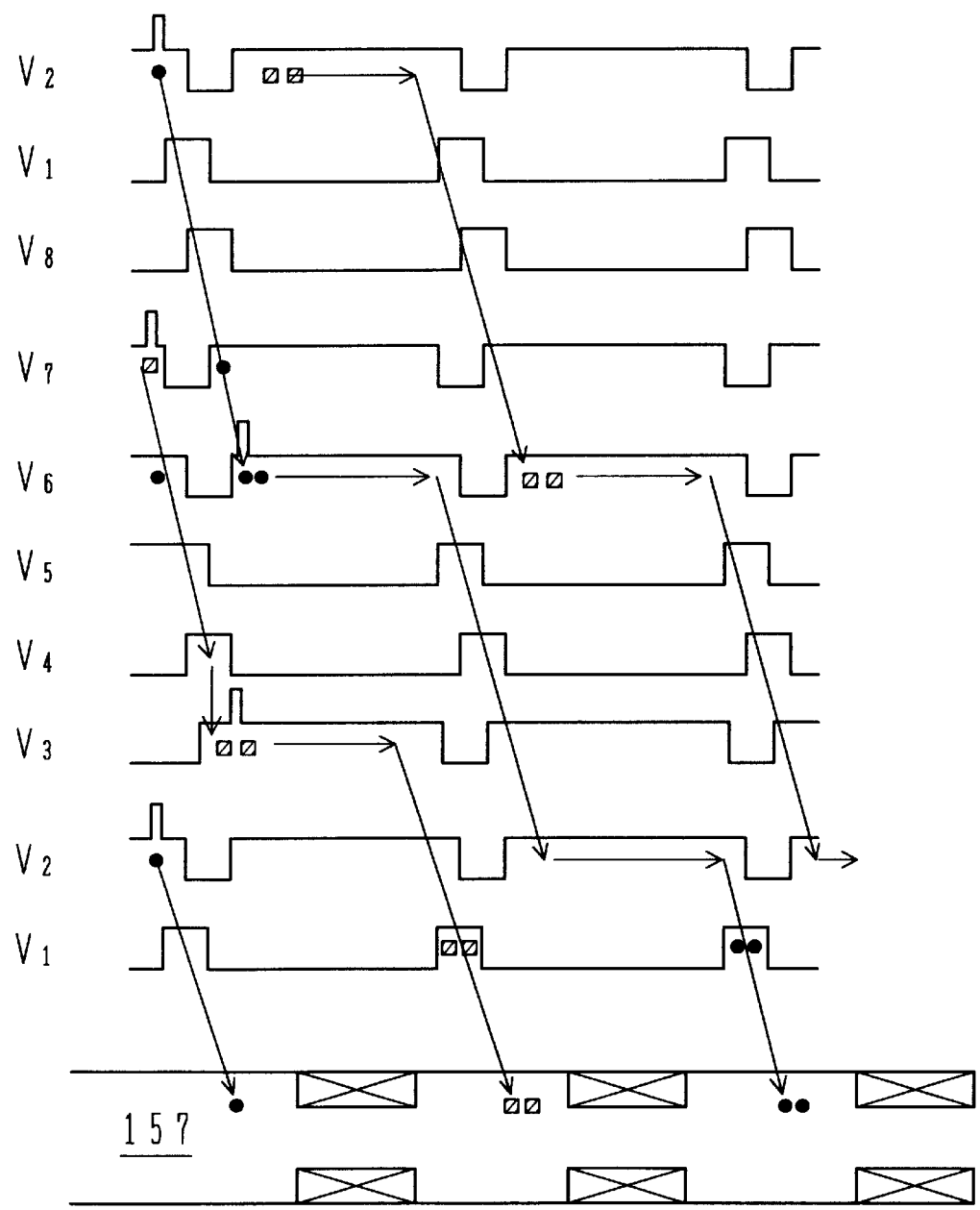
FIG. 15 is a timing chart illustrating the operation of reading a monitor image taken with the solid state image pickup device shown in FIG. 6.

As shown in FIG. 15, while a plus voltage, e.g., 8 V, is applied to the electrode V2, a high plus voltage, e.g., 15 V, is applied to the electrode V2 as the read pulse.

G charges are therefore read to the vertical charge transfer path 155a of the pixel group PG1. A plus voltage is sequentially applied to the electrodes 161-7 (V2) to 161-3 (V6) to thereby transfer G charges in the vertical direction. The G charges are therefore stored in the vertical charge transfer path 155a under the electrode 161-3.

In this state, i.e., while the plus voltage, e.g., 8 V, is applied to the electrode V6, a high plus voltage, e.g., 15 V, is applied to the electrode V6 as the read pulse.

G charges are therefore read to the vertical charge transfer path 155a of the pixel group PG1. The G charges are therefore added to the G charges transferred downward in the vertical charge transfer path under the electrode 161-3 (forming a GG signal).

A plus voltage is sequentially applied to the electrodes 161-3 (V6) to 161-8 (V1) to transfer the signal charges of the GG signal.

A plus voltage is applied to the electrodes Va and Vb to transfer the GG signal to the horizontal charge transfer path 157.

While a plus voltage, e.g., 8 V, is applied to the electrode V7, a high plus voltage, e.g., 15 V, is applied to the electrode V7 as the read pulse.

B charges are therefore read to the vertical charge transfer path 155a of the pixel group PG1. A plus voltage is sequentially applied to the electrodes 161-3 (V7) to 161-6 (V3) to thereby transfer B charges in the vertical direction. The B charges are therefore stored in the vertical charge transfer path 155a under the electrode 161-6.

In this state, i.e., while the plus voltage, e.g., 8 V, is applied to the electrode V3, a high plus voltage, e.g., 15 V, is applied to the electrode V3 as the read pulse.

B charges are therefore read to the vertical charge transfer path 155a of the pixel group PG1. The B charges are therefore added to the B charges transferred downward in the vertical charge transfer path under the electrode 161-6 (forming a BB signal).

A plus voltage is sequentially applied to the electrodes 161-6 (V3) to 161-8 (V1) to transfer the signal charges of the BB signal.

A plus voltage is applied to the electrodes Va and Vb to transfer the BB signal to the horizontal charge transfer path 157.

Figure 16:
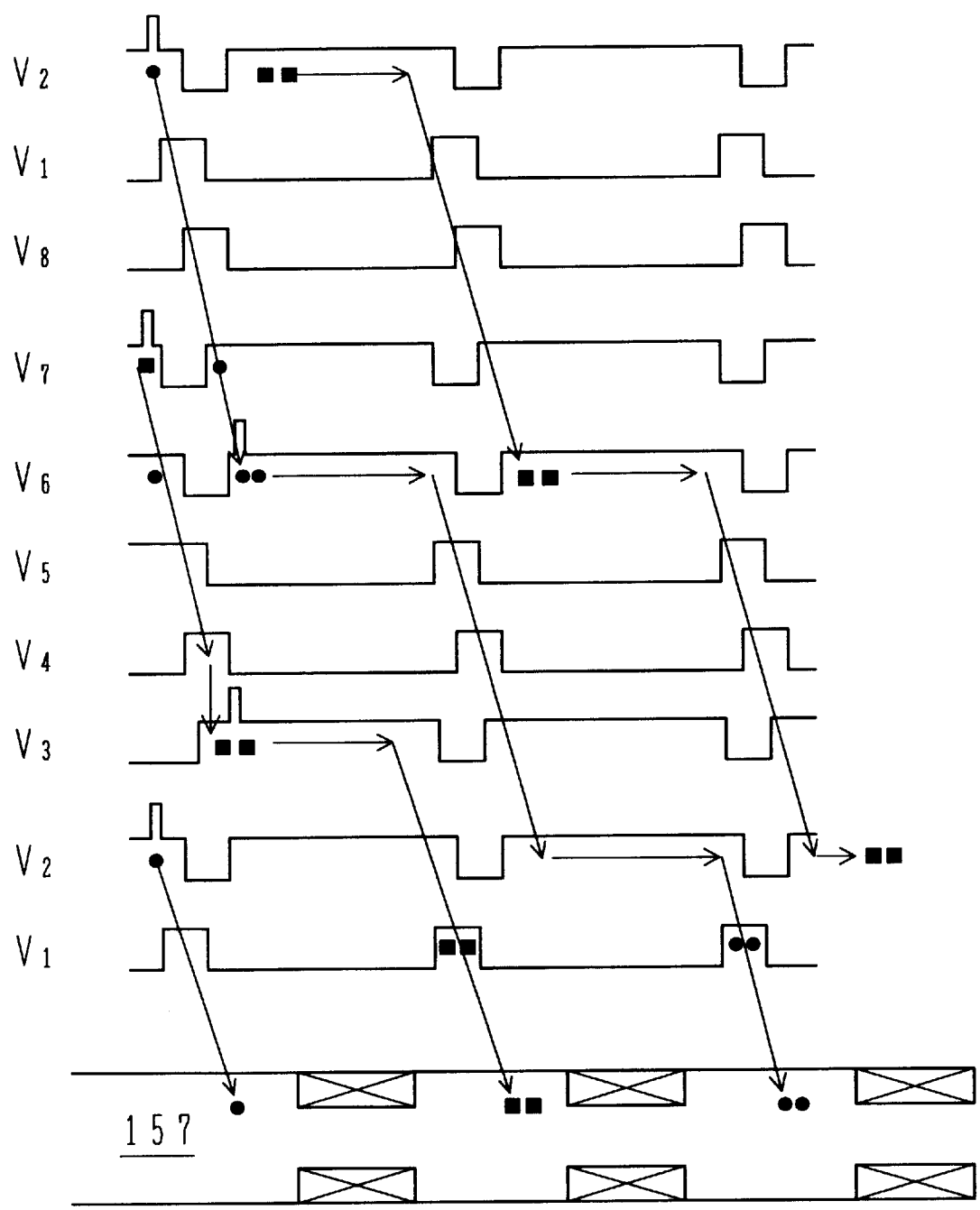
FIG. 16 is a timing chart illustrating the operation of reading a monitor image taken with the solid state image pickup device shown in FIG. 6.

FIG. 16 illustrates a method of reading electric charges from pixels in the pixel group PG2.

While a plus voltage, e.g., 8 V, is applied to the electrode V2, a high plus voltage, e.g., 15 V, is applied to the electrode V2 as the read pulse.

G charges are therefore read to the vertical charge transfer path 155b of the pixel group PG2. A plus voltage is sequentially applied to the electrodes 161-1 (V2) to 161-3 (V6) to thereby transfer G charges in the vertical direction. The G charges are therefore stored in the vertical charge transfer path 155b under the electrode 161-3.

In this state, i.e., while the plus voltage, e.g., 8 V, is applied to the electrode V6, a high plus voltage, e.g., 15 V, is applied to the electrode V6 as the read pulse.

G charges are therefore read to the vertical charge transfer path 155b of the pixel group PG2. The G charges are therefore added to the G charges transferred downward in the vertical charge transfer path 155b under the electrode 161-3 (forming a GG signal).

A plus voltage is sequentially applied to the electrodes 161-4 (V5) to 161-8 (V1) to transfer the signal charges of the GG signal.

A plus voltage is applied to the electrodes Va and Vb to transfer the GG signal to the horizontal charge transfer path 157.

While a plus voltage, e.g., 8 V, is applied to the electrode V7, a high plus voltage, e.g., 15 V, is applied to the electrode V7 as the read pulse.

R charges are therefore read to the vertical charge transfer path 155b of the pixel group PG2. A plus voltage is sequentially applied to the electrodes 161-2 (V7) to 161-6 (V3) to thereby transfer R charges in the vertical direction. The R charges are therefore stored in the vertical charge transfer path 155b under the electrode 161-6.

In this state, i.e., while the plus voltage, e.g., 8 V, is applied to the electrode V3, a high plus voltage, e.g., 15 V, is applied to the electrode V3 as the read pulse.

R charges are therefore read to the vertical charge transfer path 155b of the pixel group PG2. The R charges are therefore added to the R charges transferred downward in the vertical charge transfer path 155b under the electrode 161-6 (forming an RR signal).

A plus voltage is sequentially applied to the electrodes 161-6 (V3) to 161-8 (V1) to transfer the signal charges of the RR signal.

A plus voltage is applied to the electrodes Va and Vb to transfer the RR signal to the horizontal charge transfer path 157.

Figure 17:
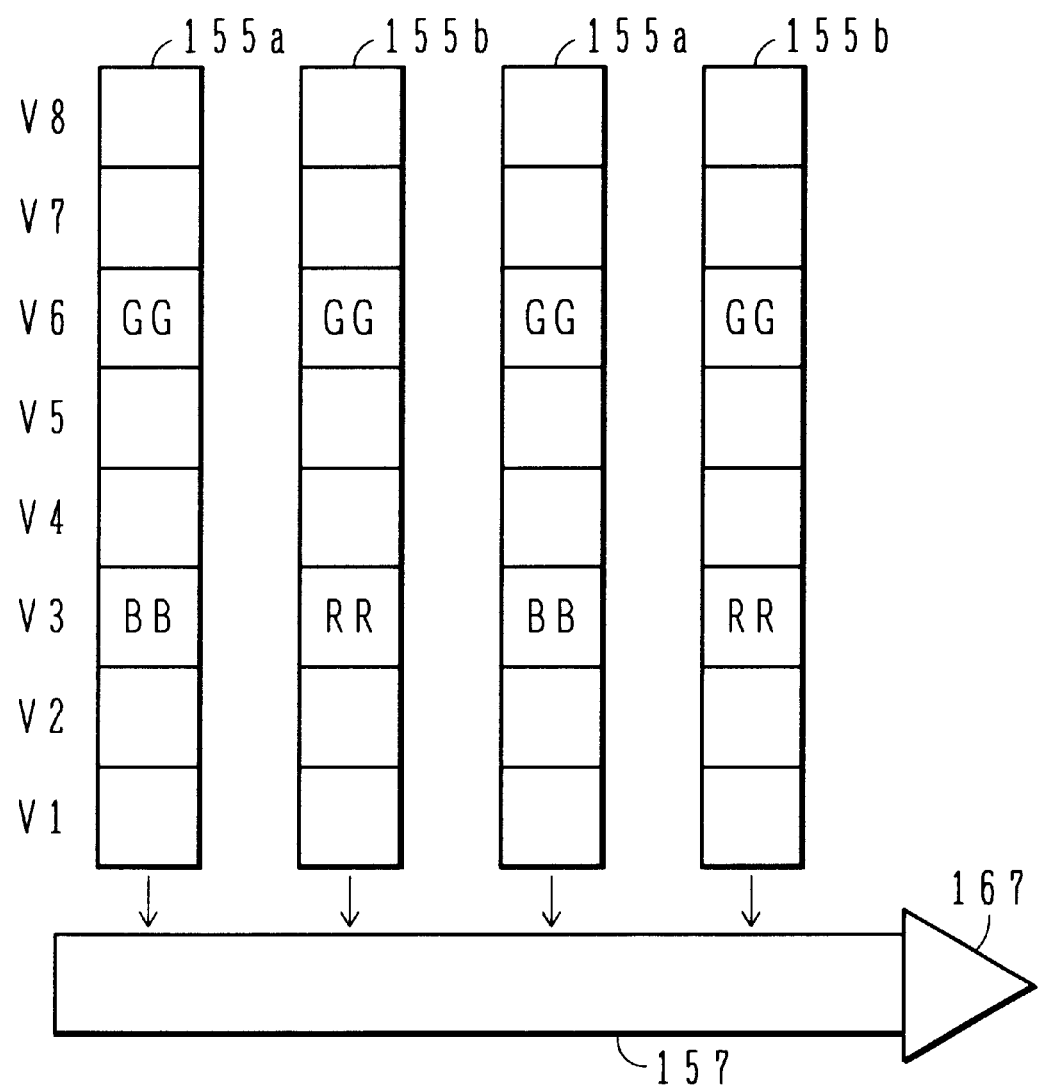
FIG. 17 is a diagram showing the positions of color signals on the vertical charge transfer paths during the operation of reading a monitor image taken with the solid state image pickup device shown in FIG. 6.
Figure 18:
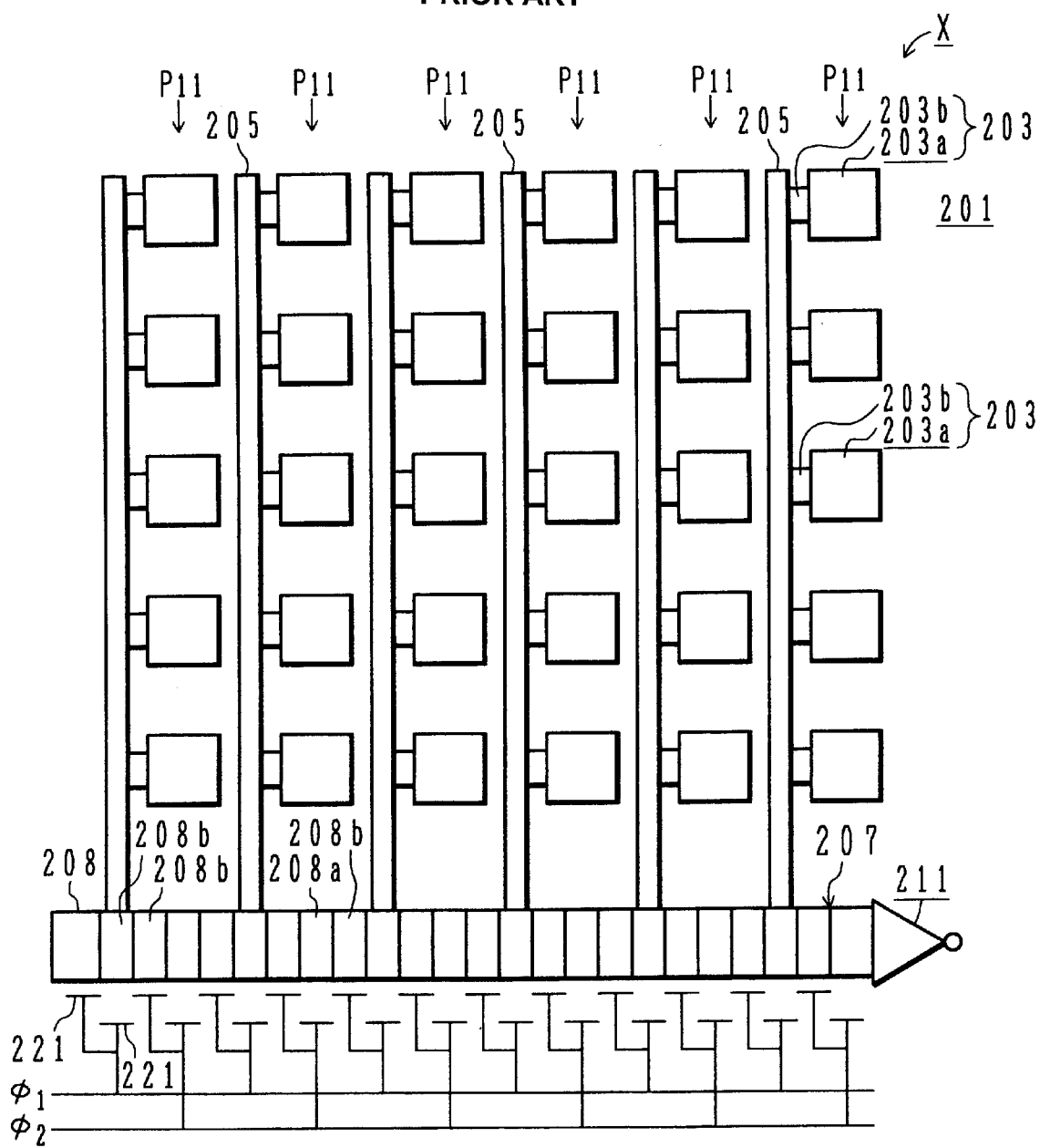
FIG. 18 is a plan view of a conventional solid state image pickup device, mainly showing the structure of a semiconductor region.
Figure 19:
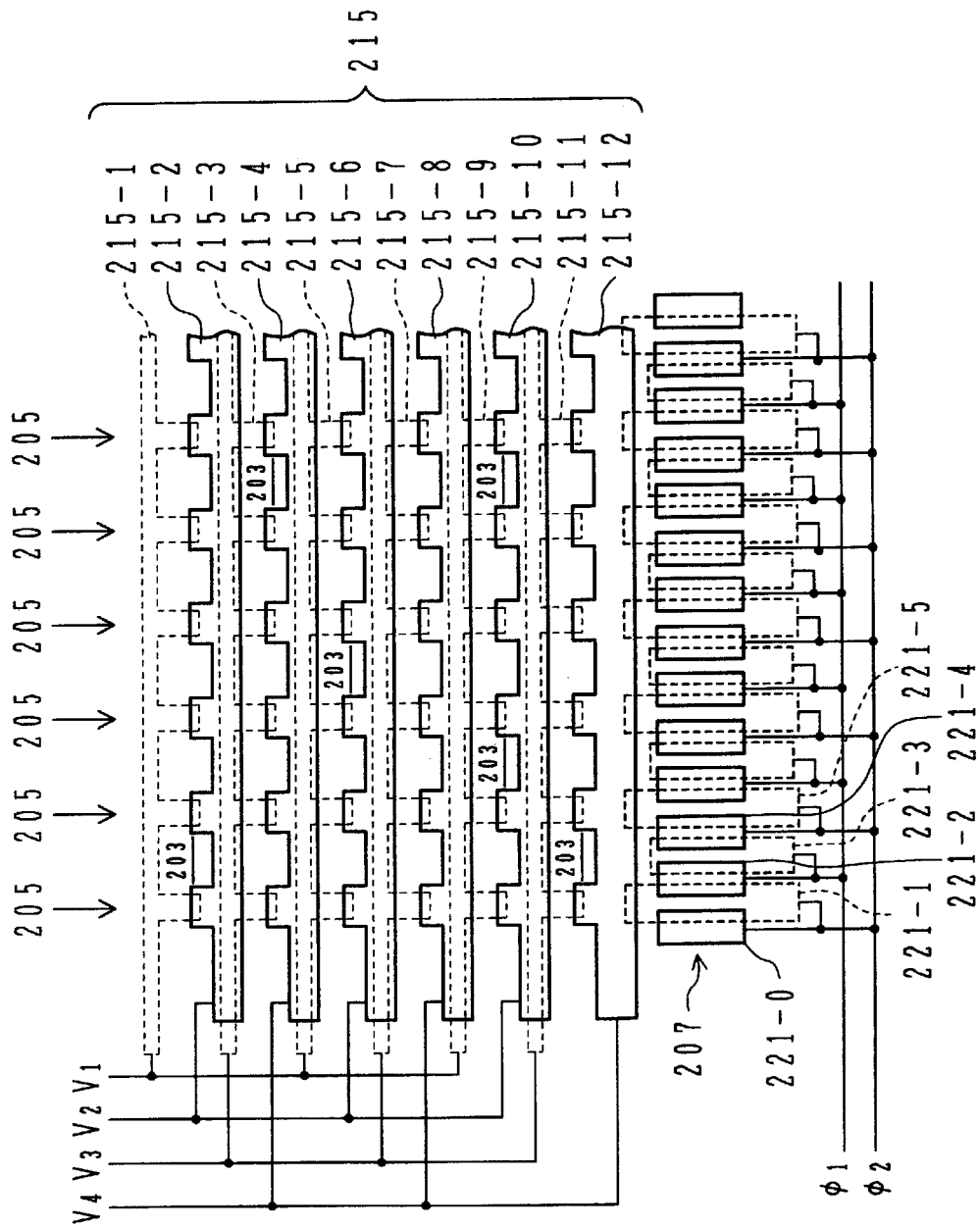
FIG. 19 is a plan view of the conventional solid state image pickup device, mainly showing the structure of charge transfer electrodes.

FIG. 17 shows the layout of electric charges of respective colors read from the photodiodes to the vertical charge transfer paths 155a and 155b by the above-described read method.

The added BB charges are stored in the vertical charge transfer path 155a under the electrode V3. The added GG charges are stored in the vertical charge transfer path 155a under the electrode V6.

The added RR charges are stored in the vertical charge transfer path 155b under the electrode V3. The added GG charges are stored in the vertical charge transfer path 155b under the electrode V3.

The electric charges of RR, BB and GG are stored in other vertical charge transfer paths 155a and 155b in a similar manner.

As described with reference to FIGS. 15 to 17, the solid state image pickup device can display a moving image quickly by reading pixels through thinning.

Moreover, since the signals of the same colors are added, the image pickup sensitivity can be improved and a clear image can be formed.

Although the above-described method of reading a solid state image pickup device utilizes the GG/RG alternate array, other color filter arrays may also be used.

In thinning pixels, although the read voltages are applied to two adjacent electrodes in the vertical direction among a group of eight vertical charge transfer electrodes, the read voltages may be applied to three of more vertical charge transfer electrodes.

In the solid state image pickup device, signals of two adjacent pixel columns are read to a single common vertical charge transfer path. It is therefore possible to mitigate a patterning precision of a vertical charge transfer path. The relative size of a pixel, e.g., a photodiode, can be made large. The amount of electric charges accumulated in a pixel can be increased. From another point of view, the pixel size can be made small assuming that the patterning precision of the vertical charge transfer path is the same.

The number of stages of the horizontal charge transfer path connected to the vertical charge transfer paths is a half of the number of photodiodes disposed in one row. The pitch of the horizontal charge transfer electrodes can therefore be made large. The horizontal transfer path can be formed at a low patterning precision. Manufacture yields of solid state image pickup devices can be improved.

By using the method of reading a solid state image pickup device of this invention, all pixels of a still image can be read. Since thinning is easy, a moving image to be monitored can be easily reproduced.

In the solid state image pickup device of the embodiments, a pixel of generally a square shape is used. The pixel may take other polygonal shapes different from a square shape, such as a rectangle and a hexagon.

The color filter array of a solid state image pickup device may take other arrays if they can realize color image pickup. In addition to the color filter array based on three primary colors (red (R), green (G) and blue (B)), so-called complementary color filter arrays may also be used.

A complementary color type color filter array may be: a combination of green (G), cyan (Cy) and yellow (Y); a combination of cyan (Cy), yellow (Ye) and white or achromatic color (W); a combination of cyan (Cy), magenta (Mg), yellow (Ye) and green (G); a combination of cyan (Cy), yellow (Ye), green (G) and white or achromatic color (W); or the like.

The pattern of a primary color filter array may be: a perfect G stripe RB perfect checkered pattern used for the embodiments; a Bayer type; an interline type; a G stripe RB checkered pattern; or the like.

The present invention has been described in connection with the preferred embodiments. The invention is not limited only to the above embodiments. It is apparent that various modifications, improvements, combinations, and the like can be made by those skilled in the art.

What is claimed is:

1. A solid state image pickup device comprising:
   a plurality of pixel groups disposed on a two-dimensional plane defined by horizontal and vertical directions, said plurality of pixel groups being juxtaposed in the horizontal direction, each of said pixel groups including a first pixel column and a second pixel column, the first pixel column including a plurality of pixels regularly disposed at a first pixel pitch in the vertical direction, the second pixel column including a plurality of pixels regularly disposed at the first pixel pitch and displaced by half the first pixel pitch in the vertical direction relative to the first pixel column, the second pixel columns being disposed in the horizontal direction an intermediate position of adjacent first pixel columns of said pixel groups;
   a first separation region formed between adjacent ones of said pixel groups;
   a single vertical charge transfer path extending in the vertical direction and weaving between the first and second pixel columns of each of said pixel groups;
   a first read gate disposed between each pixel in said first pixel column and said vertical charge transfer path;
   a second read gate disposed between each pixel in said second pixel column and said vertical charge transfer path; and
   a horizontal charge transfer path formed at one end of a plurality of said vertical charge transfer paths for receiving electric charges transferred from said vertical charge transfer paths and transferring the electric charges in the horizontal direction.

2. A solid state image pickup device according to claim 1, wherein:
   the pixel includes a photoelectric conversion element formed in an area defined by four oblique sides slanted relative to the horizontal and vertical directions;
   said first separation region is formed along a first set of right or left oblique sides among the four oblique sides of the pixel on an opposite side to said vertical charge transfer path;
   each of said first and second read gates is formed near said vertical charge transfer path along one of a second set of upper and lower oblique sides on a side opposite to a region where said first separation region is formed; further comprising a second separation region formed between the pixels and the vertical charge transfer path along the oblique side where said first or second read gate is not formed;
   a plurality of vertical charge transfer electrodes formed extending in the horizontal direction, each of said vertical charge transfer electrodes being formed between pixels of a first pixel row regularly disposed in a row direction and included in the first pixel columns and pixels of a second pixel row adjacent to the first pixel row in the vertical direction regularly disposed in the row direction and included in the second pixel columns.

3. A solid state image pickup device according to claim 1 or 2, wherein the pixel is formed in a rectangular area defined by the four oblique sides.

4. A solid state image pickup device according to claim 1 or 2, wherein the pixel is formed in a polygonal area defined by the four oblique sides.

5. A solid state image pickup device according to claim 1, further comprising:
   a plurality of vertical charge transfer electrode formed extending in the horizontal direction, each of said vertical charge transfer electrodes being formed between pixels of a first pixel row regularly disposed in a row direction and included in the first pixel column and pixels of a second pixel row adjacent to the first pixel row in the vertical direction and regularly disposed in the row direction a driver circuit for independently applying a voltage to each of a set of eight vertical charge transfer electrodes adjacent in the vertical direction among said plurality of vertical charge transfer electrodes.

6. A solid state image pickup device according to claim 5, wherein:

the pixel in the first pixel column is a green pixel including a photoelectric conversion element and a green filter; and the pixels in the second pixel column comprise a red pixel including a photoelectric conversion element and a red filter and a blue pixel including a photoelectric conversion element and a blue filter, the red and blue pixels being alternately disposed in the vertical direction and in the horizontal direction.

7. A method of reading a solid state image pickup device, the solid state image pickup device comprising:

a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at the first pixel pitch and displaced by half the first pixel pitch in the vertical direction relative to the first pixel column, the second pixel columns being disposed in the horizontal direction an intermediate position of adjacent first pixel columns of the pixel groups;

a first separation region formed between adjacent ones of the pixel groups;

a single vertical charge transfer path extending in the vertical direction and weaving between the first and second pixel columns of each of the pixel groups;

a first read gate disposed between each pixel in the first pixel column and the vertical charge transfer path;

a second read gate disposed between each pixel in the second pixel column and the vertical charge transfer path; and a horizontal charge transfer path formed at one end of a plurality of the vertical charge transfer paths for receiving electric charges transferred from the vertical charge transfer paths and transferring the electric charges in the horizontal direction, wherein: the pixel includes a photoelectric conversion element formed in an area defined by four oblique sides slanted relative to the horizontal and vertical directions;

the first separation region is formed along a first set of right or left oblique sides among the four oblique sides of the pixel on an opposite side to the vertical charge transfer path;

each of the first and second read gates is formed near the vertical charge transfer path along one of a second set of upper and lower oblique sides on a side opposite to a region where the first separation region is formed; further comprising a second separation region formed between the pixels and the vertical charge transfer path along the oblique side where the first or second read gate is not formed;

a plurality of vertical charge transfer electrodes formed extending in the horizontal direction, each of the vertical charge transfer electrodes being formed between pixels of a first pixel row regularly disposed in a row direction and included in the first pixel columns and pixels of a second pixel row adjacent to the first pixel row in the vertical direction and regularly disposed in the row direction and included in the second pixel columns, the method comprises:

a first field output step including a step of reading electric charges from the pixels in a first field to the vertical charge transfer paths by applying read pulses to the vertical charge transfer electrodes at an n-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to an external;

a second field output step including a step of reading electric charges from the pixels in a second field to the vertical charge transfer paths by applying read pulses to the vertical charge transfer electrodes at an (n+1)-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to the external; and a third field output step including a step of reading electric charges from the pixels in a third field to the vertical charge transfer paths by applying read pulses to the vertical charge transfer electrodes at an (n+2)-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to the external, wherein the first to third fields are different fields of the solid state image pickup device.

8. A method according to claim 7, further comprising:

a fourth field output step including a step of reading electric charges from the pixels in a fourth field to the vertical charge transfer paths by applying read pulses to the vertical charge transfer electrodes at an (n+3)-th row and every predetermined rows and a step of transferring the electric charges in the vertical charge transfer paths toward the horizontal charge transfer path by sequentially applying a voltage to the vertical charge transfer electrodes, and transferring the electric charges transferred to the horizontal charge transfer path and outputting the electric charges to the external, wherein the first to fourth fields are different fields of the solid state image pickup device.

9. A method of reading a solid state image pickup device, the solid state image pickup device comprising:

a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at the first pixel pitch and displaced by half the first pixel pitch in the vertical direction relative to the first pixel column, the second pixel columns being disposed in the horizontal direction an intermediate position of adjacent first pixel columns of the pixel groups;

a first separation region formed between adjacent ones of the pixel groups;

a single vertical charge transfer path extending in the vertical direction and weaving between the first and second pixel columns of each of the pixel groups;

a first read gate disposed between each pixel in the first pixel column and the vertical charge transfer path;

a second read gate disposed between each pixel in the second pixel column and the vertical charge transfer path;

a plurality of vertical charge transfer electrodes formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction; a driver circuit for independently applying a voltage to each of a set of eight vertical charge transfer electrodes adjacent in the vertical direction among said plurality of vertical charge transfer electrodes;

a horizontal charge transfer path formed at one end of a plurality of the vertical charge transfer paths for receiving electric charges transferred from the vertical charge transfer paths and transferring the electric charges in the horizontal direction; and an output amplifier formed at one end of said horizontal charge transfer path for amplifying electric charges supplied from said horizontal charge transfer path and outputting to an external, wherein: the pixel in the first pixel column is a first color pixel including a photoelectric conversion element and a first color filter; and the pixels in the second pixel column comprise a second color pixel including a photoelectric conversion element and a second color filter and a third color pixel including a photoelectric conversion element and a third color filter, the second and third color pixels being alternately disposed in the vertical direction and in the horizontal direction, the method comprises:

a) a step of reading electric charges to the vertical charge transfer paths by sequentially applying a read pulse to the first to eighth vertical charge transfer electrodes so as to read the electric charges of a same color from a same vertical charge transfer path;

b) a step of transferring the electric charges read to the vertical charge transfer paths toward the horizontal charge transfer path;

c) a step of transferring the electric charges read to the horizontal charge transfer path toward the output amplifier;

d) amplifying the electric charges supplied from the horizontal charge transfer path and outputting the electric charges to the external; and e) repeating said steps a) to d) for pixels of different rows to read electric charges from all the pixels.

10. A method according to claim 9, wherein said step a) performs a thinning read step by applying the read voltage to two vertical charge transfer electrodes adjacent in the vertical direction among the first to eighth vertical charge transfer electrodes.

11. A method according to any one of claim 9, wherein the first color is green, the second color is red and the third color is blue.

12. A method of reading a solid state image pickup device, the solid state image pickup device comprising:

a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at the first pixel pitch and displaced by half the first pixel pitch in the vertical direction relative to the first pixel column, the second pixel columns being disposed in the horizontal direction an intermediate position at of adjacent first pixel columns of the pixel groups;

a first separation region formed between adjacent ones of the pixel groups;

a single vertical charge transfer path extending in the vertical direction and weaving between the first and second pixel columns of each of the pixel groups;

a first read gate disposed between each pixel in the first pixel column and the vertical charge transfer path;

a second read gate disposed between each pixel in the second pixel column and the vertical charge transfer path;

a plurality of vertical charge transfer electrodes formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction; a driver circuit for independently applying a voltage to each of a set of eight vertical charge transfer electrodes adjacent in the vertical direction among said plurality of vertical charge transfer electrodes; and a horizontal charge transfer path formed at one end of a plurality of the vertical charge transfer paths for receiving electric charges transferred from the vertical charge transfer paths and transferring the electric charges in the horizontal direction; and an output amplifier formed at one end of said horizontal charge transfer path for amplifying electric charges supplied from said horizontal charge transfer path and outputting to an external, wherein:

the pixel in the first pixel column is a first color pixel including a photoelectric conversion element and a first color filter; and the pixels in the second pixel column comprise a second color pixel including a photoelectric conversion element and a second color filter and a third color pixel including a photoelectric conversion element and a third color filter, the second and third color pixels being alternately disposed in the vertical direction and in the horizontal direction, the method comprises:

a) a step of reading electric charges to the vertical charge transfer paths by sequentially applying a read pulse to two vertical charge transfer electrodes not adjacent in the vertical direction and corresponding to pixels in the first and second pixel columns;

b) a step of transferring the electric charges read by said step a) in the vertical charge transfer paths until electric charges of a same color as the read electric charges can be read;

c) after said step b), reading electric charges of the same color and adding the read electric charges to the electric charges transferred at said step b);

d) transferring the electric charges added at said step c) from the vertical charge transfer path to the horizontal charge transfer path, e) transferring the electric charges transferred in the horizontal charge transfer path toward the output amplifier; and f) amplifying the electric charges supplied from the horizontal charge transfer path and outputting the electric charges to the external.

13. A method according to claim 12, wherein the first color is green, the second color is red and the third color is blue.

14. A method of reading a solid state image pickup device, the solid state image pickup device comprising: a plurality of pixel groups disposed on a two-dimensional plane defined by horizontal and vertical directions, the plurality of pixel groups being juxtaposed in the horizontal direction, each of the pixel groups including a first pixel column and a second pixel column, the first pixel column including a plurality of pixels regularly disposed at a first pixel pitch in the vertical direction, the second pixel column including a plurality of pixels regularly disposed at the first pixel pitch in and displaced by half the first pixel pitch the vertical direction relative to the first pixel column, the second pixel columns being disposed in the horizontal direction an intermediate position of adjacent first pixel columns of the pixel groups;

a first separation region formed between adjacent ones of the pixel groups;

a single vertical charge transfer path extending in the vertical direction and weaving between the first and second pixel columns of each of the pixel groups;

a first read gate disposed between each pixel in the first pixel column and the vertical charge transfer path;

a second read gate disposed between each pixel in the second pixel column and the vertical charge transfer path;

a plurality of vertical charge transfer electrodes formed extending in the horizontal direction, each of the vertical charge transfer electrodes being formed between pixels of a first pixel row regularly disposed in a row direction and included in the first pixel column and pixels of a second pixel row adjacent to the first pixel row in the vertical direction and regularly disposed in the row direction; a driver circuit for independently applying a voltage to each of a set of eight vertical charge transfer electrodes adjacent in the vertical direction among said plurality of vertical charge transfer electrodes;

a horizontal charge transfer path formed at one end of a plurality of the vertical charge transfer paths for receiving electric charges transferred from the vertical charge transfer paths and transferring the electric charges in the horizontal direction; and an output amplifier formed at one end of said horizontal charge transfer path for amplifying electric charges supplied from said horizontal charge transfer path and outputting to an external, wherein:

the pixel in the first pixel column is a first color pixel including a photoelectric conversion element and a first color filter; and the pixels in the second pixel column comprise a second color pixel including a photoelectric conversion element and a second color filter and a third color pixel including a photoelectric conversion element and a third color filter, the second and third color pixels being alternately disposed in the vertical direction and in the horizontal direction, the method comprises:

in reading a still image, a) a step of reading electric charges from the photoelectric conversion elements to the vertical charge transfer paths by sequentially applying a read pulse to the first to eighth vertical charge transfer electrodes so as to read the electric charges of a same color from a same vertical charge transfer path;

b) a step of transferring the electric charges read to the vertical charge transfer paths toward the horizontal charge transfer path;

c) a step of transferring the electric charges read to the horizontal charge transfer path toward the output amplifier;

d) amplifying the electric charges supplied from the horizontal charge transfer path and outputting the electric charges to the external; and e) repeating said steps a) to d) for pixels of different rows to read electric charges from all the pixels, and in reading a moving image, a) a step of reading electric charges from the photoelectric conversion elements to the vertical charge transfer paths by applying a read pulse to two vertical charge transfer electrodes adjacent in the vertical direction among the first to eighth vertical charge transfer electrodes;

b) a step of collecting the electric charges read to the vertical charge transfer paths;

c) a step of transferring the electric charges from the vertical charge transfer path to the horizontal charge transfer path;

d) a step of transferring the electric charges transferred to the horizontal charge transfer path to the output amplifier; and e) amplifying the electric charges supplied from the horizontal charge transfer path and outputting the electric charges to the external.

15. A method according to any one of claim 14, wherein the first color is green, the second color is red and the third color is blue.

* * * * *